(12) United States Patent
Yu et al.

(10) Patent No.: US 12,057,407 B2
(45) Date of Patent: Aug. 6, 2024

(54) SEMICONDUCTOR PACKAGE AND METHOD

(71) Applicant: Taiwan Semiconductor Manufacturing Co., Ltd., Hsinchu (TW)

(72) Inventors: Chen-Hua Yu, Hsinchu (TW); Jeng-Shien Hsieh, Kaohsiung (TW); Chuei-Tang Wang, Taichung (TW); Chieh-Yen Chen, Taipei (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 18/362,599

(22) Filed: Jul. 31, 2023

(65) Prior Publication Data

US 2023/0378080 A1 Nov. 23, 2023

Related U.S. Application Data

(62) Division of application No. 17/242,704, filed on Apr. 28, 2021.

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............ H01L 23/5389; H01L 21/4853; H01L 21/4857; H01L 21/486; H01L 21/565; H01L 21/568; H01L 21/6835; H01L 23/3128; H01L 23/5383; H01L 23/5384; H01L 23/5386; H01L 24/19; H01L 24/20; H01L 25/0652; H01L 2221/68372; H01L 2224/214; H01L 2224/215; H01L 2225/06548; H01L 2225/06513;
(Continued)

(56) References Cited

U.S. PATENT DOCUMENTS 8,993,380 B2 3/2015 Hou et al.
9,000,584 B2 4/2015 Lin et al.
(Continued)

*Primary Examiner* — Kyoung Lee
*Assistant Examiner* — Christina A Sylvia
(74) *Attorney, Agent, or Firm* — Slater Matsil, LLP

(57) ABSTRACT

A semiconductor device includes a first plurality of dies on a wafer, a first redistribution structure over the first plurality of dies, and a second plurality of dies on the first redistribution structure opposite the first plurality of dies. The first redistribution structure includes a first plurality of conductive features. Each die of the first plurality of dies are bonded to respective conductive features of the first plurality of conductive features by metal-metal bonds on a bottom side of the first redistribution structure. Each die of the second plurality of dies are bonded to respective conductive features of the first plurality of conductive features in the first redistribution structure by metal-metal bonds on a top side of the first redistribution structure.

20 Claims, 36 Drawing Sheets

(51) Int. Cl.
*H01L 21/56* (2006.01)
*H01L 21/683* (2006.01)
*H01L 23/00* (2006.01)
*H01L 23/31* (2006.01)
*H01L 25/065* (2023.01)

(52) U.S. Cl.
CPC .......... *H01L 21/486* (2013.01); *H01L 21/565* (2013.01); *H01L 21/568* (2013.01); *H01L 21/6835* (2013.01); *H01L 23/3128* (2013.01); *H01L 23/5383* (2013.01); *H01L 23/5384* (2013.01); *H01L 23/5386* (2013.01); *H01L 24/19* (2013.01); *H01L 24/20* (2013.01); *H01L 25/0652* (2013.01); *H01L 2221/68372* (2013.01); *H01L 2224/214* (2013.01); *H01L 2224/215* (2013.01); *H01L 2225/06548* (2013.01)

(58) Field of Classification Search
CPC ........... H01L 2225/06541; H01L 25/16; H01L 25/18; H01L 25/50; H01L 23/147; H01L 23/49827; H01L 23/49816; H01L 2225/06517; H01L 21/50; H01L 21/56; H01L 23/3114; H01L 23/3121; H01L 23/488; H01L 24/02; H01L 2224/02379
See application file for complete search history.

(56) References Cited

U.S. PATENT DOCUMENTS

| | | | |
|---|---|---|---|
| 9,048,222 B2 | 6/2015 | Hung et al. | |
| 9,048,233 B2 | 6/2015 | Wu et al. | |
| 9,064,879 B2 | 6/2015 | Hung et al. | |
| 9,111,949 B2 | 8/2015 | Yu et al. | |
| 9,263,511 B2 | 2/2016 | Yu et al. | |
| 9,281,254 B2 | 3/2016 | Yu et al. | |
| 9,299,649 B2 | 3/2016 | Chiu et al. | |
| 9,368,460 B2 | 6/2016 | Yu et al. | |
| 9,372,206 B2 | 6/2016 | Wu et al. | |
| 9,425,126 B2 | 8/2016 | Kuo et al. | |
| 9,443,783 B2 | 9/2016 | Lin et al. | |
| 9,461,018 B1 | 10/2016 | Tsai et al. | |
| 9,496,189 B2 | 11/2016 | Yu et al. | |
| 9,666,502 B2 | 5/2017 | Chen et al. | |
| 9,735,131 B2 | 8/2017 | Su et al. | |
| 9,748,167 B1 | 8/2017 | Lin | |
| 2008/0265399 A1 | 10/2008 | Chao | |
| 2014/0106508 A1 | 4/2014 | Sutardja et al. | |
| 2016/0196988 A1 | 7/2016 | Sankman et al. | |
| 2017/0133351 A1* | 5/2017 | Su | H01L 23/5389 |
| 2017/0170155 A1 | 6/2017 | Yu et al. | |
| 2018/0226349 A1* | 8/2018 | Yu | H01L 21/568 |
| 2021/0175178 A1 | 6/2021 | We et al. | |
| 2022/0415572 A1 | 12/2022 | Park | |

* cited by examiner

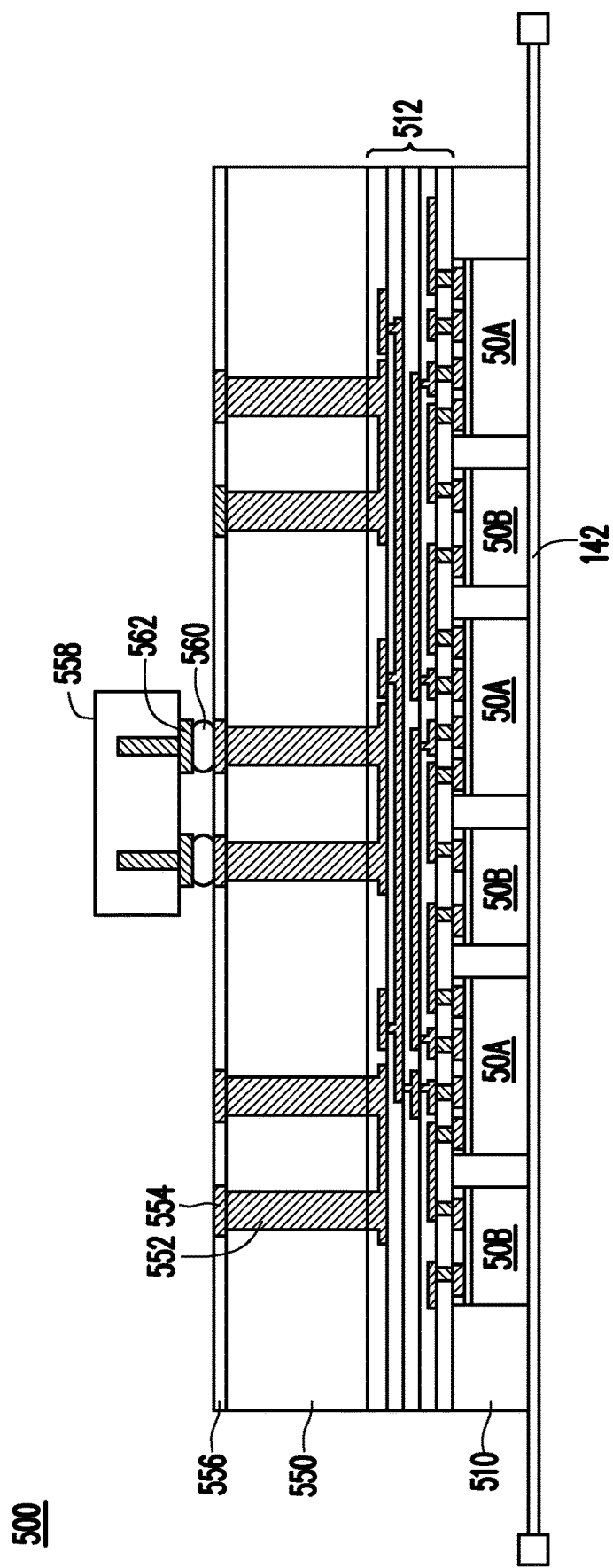

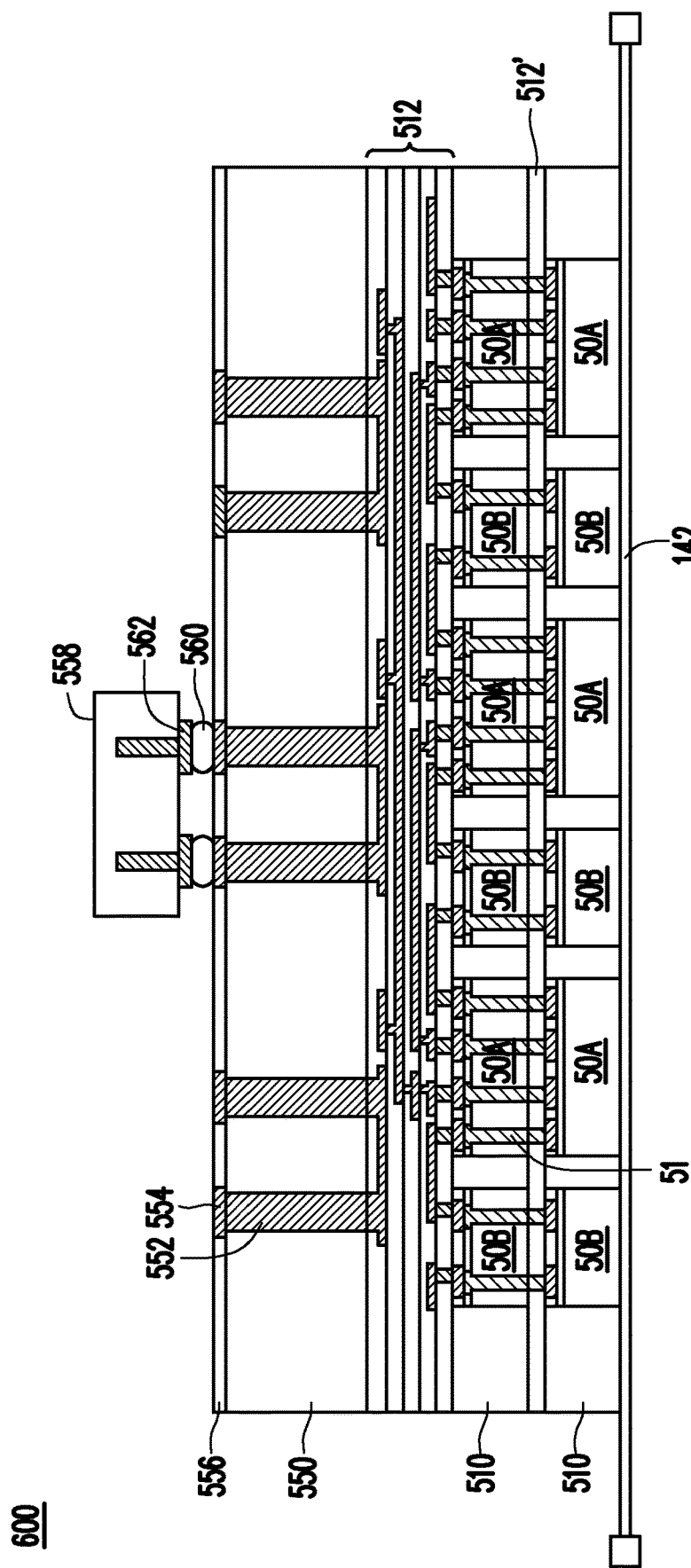

SEMICONDUCTOR PACKAGE AND METHOD

PRIORITY CLAIM AND CROSS-REFERENCE

This application is a divisional of U.S. patent application Ser. No. 17/242,704, filed on Apr. 28, 2021, which application is hereby incorporated herein by reference.

BACKGROUND

As semiconductor technologies continue to evolve, integrated circuit dies are becoming increasingly smaller. Further, more functions are being integrated into the dies. Accordingly, the numbers of input/output (I/O) pads needed by dies has increased while the area available for the I/O pads has decreased. The density of the I/O pads has risen quickly over time, increasing the difficulty of die packaging.

In some packaging technologies, integrated circuit dies are singulated from wafers before they are packaged. An advantageous feature of this packaging technology is the possibility of forming fan-out packages, which allow the I/O pads on a die to be redistributed to a greater area. The number of I/O pads on the surfaces of the dies may thus be increased.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-12A illustrate cross-sectional views of intermediate steps during a process for forming a system-on-wafer assembly, in accordance with some embodiments.

FIGS. 23-32A illustrate cross-sectional of intermediate steps during a process for forming yet another system-on-wafer assembly, in accordance with some embodiments.

FIG. 32B illustrates a cross-sectional view of yet another system-on-wafer assembly, in accordance with some embodiments.

DETAILED DESCRIPTION

Figure 1:
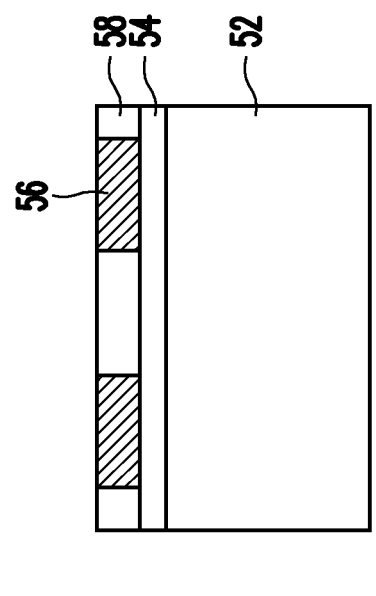
FIG. 1 illustrates a cross-sectional view of an integrated circuit die, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Embodiments may provide high interconnect density and flexible routing with thin interconnect layers for wafer scale multi-chip packages. In order to achieve these advantages, interposers not containing silicon may be used in addition to the redistribution layers (RDLs) used in conventional fan-out packages. The multiple dies may form a large computation system on a wafer instead of a conventional printed circuit board (PCB). Multiple chips (also referred to as dies) are implemented on wafer scale interposers, such as back end of line (BEOL) layers. The wafer scale BEOL layers may support electrical interconnects between a first die and neighboring dies and/or between the first die and others dies located at larger distances from the first die, such as on an opposite side of the wafer scale interconnect. The reticle size limitation for forming the wafer scale interposer may be broken by overlapping lithographic exposures of the BEOL using stitching technology to integrate each reticle of the BEOL or by using a wafer scale mask over the BEOL. Dies may be bonded on one side or on both sides of the wafer scale interposer to improve yield and allow for high density integration. This single sided or double sided assembly may provide system application flexibility. Known good dies (KGDs) may be used to provide good system yield. Metal-metal bonds, such as Cu—Cu bonds, may be used between the dies and the wafer scale interposer to form fine pitch contact pads for high density signals and to form larger size contact pads with low resistance to allow for lower power in order to achieve better yield for high speed signals. Multiple system modules may be converged into one wafer scale system in order to reduce cost by simplifying system architecture. Dies with different functions such as logic, memory, input/output (I/O), power management integrated circuit (PMIC), or integrated passive device (IPD) may be integrated on the wafer scale system to provide design flexibility for different applications. Optical or mechanical connector modules may be integrated with the wafer scale interposer for wafer-to-wafer system interconnection.

FIG. 1 illustrates a cross-sectional view of an integrated circuit die 50, in accordance with some embodiments. The integrated circuit die 50 will be packaged in subsequent processing to form an integrated circuit package component. The integrated circuit die 50 may be a logic die (e.g., central processing unit (CPU), graphics processing unit (GPU), system-on-a-chip (SoC), application processor (AP), microcontroller, etc.), a memory die (e.g., dynamic random access memory (DRAM) die, static random access memory (SRAM) die, etc.), a power management die (e.g., power management integrated circuit (PMIC) die), a radio frequency (RF) die, a sensor die, a micro-electro-mechanical-system (MEMS) die, a signal processing die (e.g., digital signal processing (DSP) die), a front-end die (e.g., analog front-end (AFE) dies), an application-specific die (e.g., an application-specific integrated circuit (ASIC), a field-programmable gate array (FPGA), etc.), an input/output (I/O) die, integrated passive device (IPD) die, the like, or combinations thereof.

The integrated circuit die 50 may be formed in a wafer, which may include different device regions that are singulated in subsequent steps to form a plurality of integrated circuit dies. The integrated circuit die 50 may be processed according to applicable manufacturing processes to form integrated circuits. For example, the integrated circuit die 50 includes a semiconductor substrate 52, such as silicon, doped or undoped, or an active layer of a semiconductor-on-insulator (SOI) substrate. The semiconductor substrate 52 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The semiconductor substrate 52 has an active surface (e.g., the surface facing upwards in FIG. 1), sometimes called a front side, and an inactive surface (e.g., the surface facing downwards in FIG. 1), sometimes called a back side. Devices may be formed at the front surface of the semiconductor substrate 52. The devices may be active devices (e.g., transistors, diodes, etc.) or passive devices (e.g., capacitors, resistors, inductors, etc.).

An interconnect structure 54 is over the semiconductor substrate 52, and interconnects the devices to form an integrated circuit. The interconnect structure 54 may be formed by, for example, metallization patterns in dielectric layers on the semiconductor substrate 52. The metallization patterns include metal lines and vias formed in one or more low-k dielectric layers. The metallization patterns of the interconnect structure 54 are electrically coupled to the devices of the semiconductor substrate 52. The integrated circuit die 50 further includes pads, such as copper or aluminum pads, to which external connections are made. The pads are on the active side of the integrated circuit die 50, such as in and/or on the interconnect structure 54. One or more passivation films may be on the integrated circuit die 50, such as on portions of the interconnect structure 54. Die connectors 56, such as conductive pillars (for example, formed of a metal such as copper), are physically and electrically coupled to the interconnect structure 54. The die connectors 56 may be formed by, for example, plating, or the like. The die connectors 56 electrically couple the respective integrated circuits of the integrated circuit die 50.

Optionally, solder regions (e.g., solder balls or solder bumps) may be disposed on the pads of the interconnect structure 54. The solder balls may be used to perform chip probe (CP) testing on the integrated circuit die 50. CP testing may be performed on the integrated circuit die 50 to ascertain whether the integrated circuit die 50 is a known good die (KGD). Thus, only integrated circuit dies 50, which are KGDs, undergo subsequent processing and packaging, and dies, which fail the CP testing, are not packaged. After testing, the solder regions may be removed in subsequent processing steps.

A dielectric layer 58 may (or may not) be on the active side of the integrated circuit die 50, such as on the passivation films and the die connectors 56. The dielectric layer 58 laterally encapsulates the die connectors 56, and the dielectric layer 58 is laterally coterminous with the integrated circuit die 50. Initially, the dielectric layer 58 may bury the die connectors 56, such that the topmost surface of the dielectric layer 58 is above the topmost surfaces of the die connectors 56. In some embodiments where solder regions are disposed on the die connectors 56, the dielectric layer 58 may also bury the solder regions. Alternatively, the solder regions may be removed prior to forming the dielectric layer 58.

The dielectric layer 58 may be a polymer such as polybenzoxazole (PBO), polyimide, benzocyclobutene (BCB), or the like; a nitride such as silicon nitride or the like; an oxide such as silicon oxide, phosphosilicate glass (PSG), borosilicate glass (BSG), boron-doped phosphosilicate glass (BPSG), or the like; the like, or a combination thereof. The dielectric layer 58 may be formed, for example, by spin coating, lamination, chemical vapor deposition (CVD), or the like. In some embodiments, the die connectors 56 are exposed through the dielectric layer 58 during formation of the integrated circuit die 50. In some embodiments, the die connectors 56 remain buried and are exposed during a subsequent process for packaging the integrated circuit die 50. Exposing the die connectors 56 may remove any solder regions that may be present on the die connectors 56.

In some embodiments, the integrated circuit die 50 is a stacked device that includes multiple semiconductor substrates 52. For example, the integrated circuit die 50 may be a memory device such as a hybrid memory cube (HMC) device, a high bandwidth memory (HBM) device, or the like that includes multiple memory dies. In such embodiments, the integrated circuit die 50 includes multiple semiconductor substrates 52 interconnected by through-substrate vias (TSVs). Each of the semiconductor substrates 52 may (or may not) have an interconnect structure 54.

FIGS. 2-12D illustrate cross-sectional and plan views of intermediate steps during a process for forming a system-on-wafer assembly 100 with dies bonded to both sides of a wafer scale interposer, in accordance with some embodiments. The system-on-wafer assembly 100 may be a reconstructed wafer with one or more of the integrated circuit dies 50 being integrated into it. For example, the system-on-wafer assembly 100 may be an artificial intelligence (AI), machine learning (ML), or deep learning (DL) accelerator. Example systems for the system-on-wafer assembly 100 include AI servers, high-performance computing (HPC) systems, high power computing devices, cloud computing systems, edge computing systems, and the like. As noted above, the system-on-wafer assembly 100 is large. For example, the system-on-wafer assembly 100 can have a surface area in excess of 10,000 mm$^2$.

Figure 2:
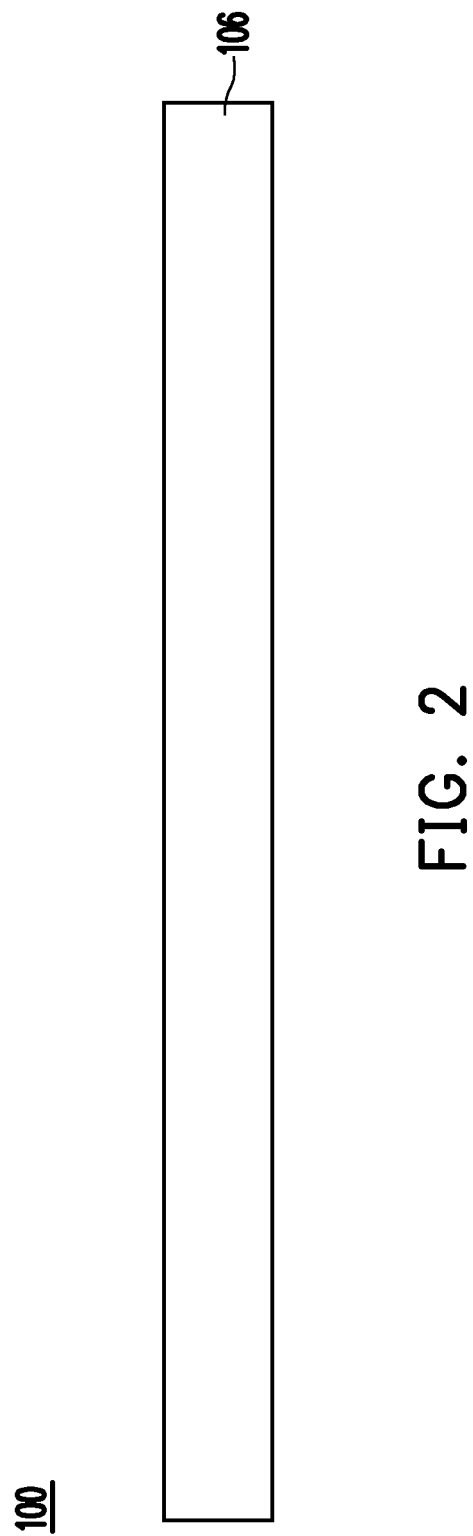

In FIG. 2, a substrate 106 is provided. The substrate 106 may be a wafer, such as silicon, doped or undoped, or an active layer of a semiconductor-on-insulator (SOI) substrate. The substrate 106 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 106 has an active surface (e.g., the surface facing upwards in FIG. 2), sometimes called a front side, and an inactive surface (e.g., the surface facing downwards in FIG. 2), sometimes called a back side.

Figure 3:
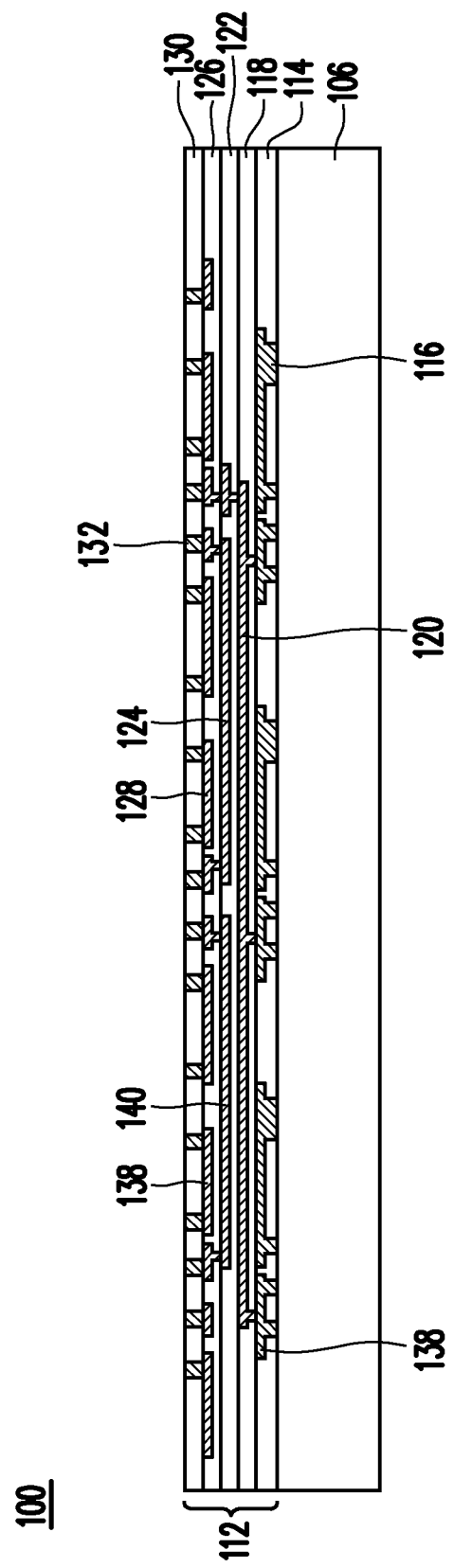

In FIG. 3, a redistribution structure 112, also referred to as an interconnect or a wafer scale interposer 112, is formed over the substrate 106. The redistribution structure 112 comprises back end of line (BEOL) layers including metallization patterns and dielectric layers. The metallization patterns may also be referred to as redistribution layers or redistribution lines. The redistribution structure 112 is shown as an example having five layers of metallization patterns. More or fewer dielectric layers and metallization patterns may be formed in the redistribution structure 112. If fewer dielectric layers and metallization patterns are to be formed, steps and process discussed below may be omitted. If more dielectric layers and metallization patterns are to be formed, steps and processes discussed below may be repeated.

FIG. 3 illustrates the formation of the redistribution structure 112. The redistribution structure 112 includes dielectric layers 114, 118, 122, 126, and 130; and metallization patterns 116, 120, 124, and 128. In some embodiments, the dielectric layers 118, 122, 126, and 130 are formed from a same dielectric material, and are formed to a same thickness. Likewise, in some embodiments, the conductive features of the metallization patterns 116, 120, 124, and 128 are formed from a same conductive material, and are formed to a same thickness.

As an example of forming the redistribution structure 112, the dielectric layer 114 is deposited on the substrate 106. In some embodiments, the dielectric layer 114 is formed of a photo-sensitive material such as PBO, polyimide, BCB, or the like, which may be patterned using a lithography mask. In some embodiments, the reticle size limitation for patterning the dielectric layer 114 on a wafer scale may be broken by overlapping lithographic exposures of the dielectric layer 114 using stitching technology to integrate each reticle of the dielectric layer 114. In some embodiments, the reticle size limitation for patterning the dielectric layer 114 on a wafer scale may be broken by using a wafer scale mask to pattern the dielectric layer 114. The dielectric layer 114 may be formed by spin coating, lamination, CVD, the like, or a combination thereof. The dielectric layer 114 is then patterned. The patterning may be by an acceptable process, such as by exposing the dielectric layer 114 to light when the dielectric layer 114 is a photo-sensitive material or by etching using, for example, an anisotropic etch. If the dielectric layer 114 is a photo-sensitive material, the dielectric layer 114 can be developed after the exposure.

The metallization pattern 116 is then formed. The metallization pattern 116 has line portions (also referred to as conductive lines or traces) on and extending along the major surface of the dielectric layer 114, and has via portions (also referred to as conductive vias) extending through the dielectric layer 114 to physically and electrically couple subsequently formed dielectric vias (TDVs) 136 (see below, FIG. 8) or subsequently attached die connectors 56 of integrated circuit dies 50C (see below, FIG. 9). As an example to form the metallization pattern 116, a seed layer is formed over the dielectric layer 114 and in the openings extending through the dielectric layer 114. In some embodiments, the seed layer is a metal layer, which may be a single layer or a composite layer comprising a plurality of sub-layers formed of different materials. In some embodiments, the seed layer comprises a titanium layer and a copper layer over the titanium layer. The seed layer may be formed using, for example, physical vapor deposition (PVD) or the like. A photoresist is then formed and patterned on the seed layer. The photoresist may be formed by spin coating or the like and may be exposed to light for patterning. The pattern of the photoresist corresponds to the metallization pattern 116. The patterning forms openings through the photoresist to expose the seed layer. A conductive material is then formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The combination of the conductive material and underlying portions of the seed layer form the metallization pattern 116. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching.

The dielectric layer 118 is then deposited on the metallization pattern 116 and dielectric layer 114. The dielectric layer 118 may be formed in a similar manner and of a similar material as the dielectric layer 114. The metallization pattern 120 is then formed. The metallization pattern 120 has line portions on and extending along the major surface of the dielectric layer 118, and has via portions extending through the dielectric layer 118 to physically and electrically couple the metallization pattern 116. The metallization pattern 120 may be formed in a similar manner and of a similar material as the metallization pattern 116.

The dielectric layer 122 is then deposited on the metallization pattern 120 and dielectric layer 118. The dielectric layer 122 may be formed in a similar manner and of a similar material as the dielectric layer 114. The metallization pattern 124 is then formed. The metallization pattern 124 has line portions on and extending along the major surface of the dielectric layer 122, and has via portions extending through the dielectric layer 122 to physically and electrically couple the metallization pattern 120. The metallization pattern 124 may be formed in a similar manner and of a similar material as the metallization pattern 116.

The dielectric layer 126 is deposited on the metallization pattern 124 and dielectric layer 122. The dielectric layer 126 may be formed in a similar manner and of a similar material as the dielectric layer 114. The metallization pattern 128 is then formed. The metallization pattern 128 has line portions on and extending along the major surface of the dielectric layer 126, and has via portions extending through the dielectric layer 126 to physically and electrically couple the metallization pattern 124. The metallization pattern 128 may be formed in a similar manner and of a similar material as the metallization pattern 116.

The dielectric layer 130 is deposited on the metallization pattern 128 and dielectric layer 126. The dielectric layer 130 may be formed in a similar manner and of a similar material as the dielectric layer 114. The metallization pattern 132 is then formed. The metallization pattern 132 has via portions extending through the dielectric layer 130 to physically and electrically couple the metallization pattern 128. In some embodiments, the metallization pattern 132 has line portions on and extending along the major surface of the dielectric layer 130. The metallization pattern 132 may be formed in a similar manner and of a similar material as the metallization pattern 116. In some embodiments, the metallization pattern 132 is formed to comprise fine pitch contact pads, which may be useful for high density signals. In some embodiments, the metallization pattern 132 is formed to comprise larger size contact pads with low resistance to allow for lower power in order to achieve better yield for high speed signals.

In some embodiments, the metallization patterns 116, 120, 124, 128, and 132 comprise electrical interconnects 138 between neighboring subsequently attached dies (see below, FIG. 4) and electrical interconnects 140 between subsequently attached dies located at larger distances from each other across the redistribution structure 112 (see below, FIG. 4). In some embodiments, the electrical interconnects 140 are between a first IC die 50 and a second IC die 50 separated by at least one other IC die 50. The redistribution structure 112, also referred to as a wafer scale interposer 112, containing electrical interconnects 138 between neighboring subsequently attached dies and electrical interconnects 140 between subsequently attached dies located at larger distances from each other may be useful for enabling design flexibility for different applications.

Figure 4:
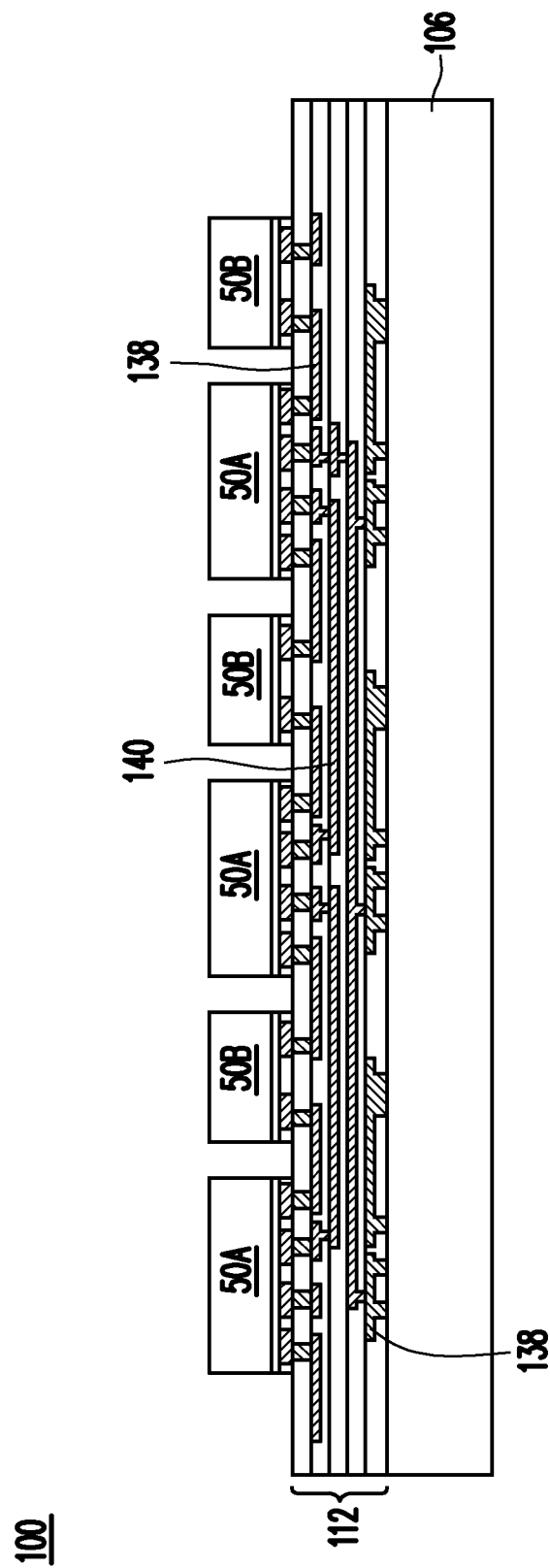

In FIG. 4, integrated circuit (IC) dies 50A and 50B, also referred to as IC dies 50, are attached to the redistribution structure 112. Known good dies (KGDs) may be used for the IC dies 50A and 50B to provide good system yield. In some embodiments, IC dies 50A are a first type of IC die and IC dies 50B are a second type of IC die such as, e.g. logic dies (e.g., central processing unit (CPU), graphics processing unit (GPU), system-on-a-chip (SoC), application processor (AP), microcontroller, etc.), memory dies (e.g., dynamic random access memory (DRAM) dies, static random access memory (SRAM) die, etc.), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), application-specific dies (e.g., an application-specific integrated circuit (ASIC), field-programmable gate array (FPGA), etc.), input/output (I/O) dies, integrated passive device (IPD) dies, or the like. In some embodiments, IC dies 50A and 50B are the same type of die or comprise three or more different types of dies. The IC dies 50A and 50B may be of the same technology node, or of different technology nodes. For example, the IC dies 50A and 50B may include dies formed at a 10 nm technology node, dies formed at a 7 nm technology node, the like, or combinations thereof.

In some embodiments, the IC dies 50A and 50B are attached to the redistribution structure 112 using a suitable bonding method, such as e.g. metal-metal bonding including Cu—Cu or Al—Al bonding, between the die connectors 56 of the IC dies 50A and 50B and the vias of the metallization pattern 128. In some embodiments, the IC dies 50A and 50B are attached to the redistribution structure 112 using hybrid bonding. As an example of hybrid bonding between the IC dies 50 and the redistribution structure 112, the dielectric layers 58 of the IC dies 50 are bonded to the dielectric layer 130 of the redistribution structure 112 through fusion bonding, and the die connectors 56 are bonded to the vias of the metallization pattern 128 through metal-to-metal bonding. The bonding includes pre-bonding and an annealing. During the pre-bonding, a small pressing force is applied to press the IC dies 50 and the redistribution structure 112 against each other. The pre-bonding may be performed at room temperature (for example, between about 21° C. to about 25° C.), although higher temperatures may be used.

After the pre-bonding, dielectric layers 58 and the dielectric layer 130 are bonded to each other. The bonding strength is improved in a subsequent annealing step, in which the IC dies 50 and the redistribution structure 112 are annealed at a temperature between about 300° C. and about 400° C., for example. The annealing may be performed for a period of time between about 1 hour and 2 hours. When temperature rises, the OH bond in the dielectric layers 58 and the dielectric layer 130 break to form strong Si—O—Si bonds, and hence the IC dies 50 and the redistribution structure 112 are bonded to each other through fusion bonds (and through Van Der Waals force). In addition, during the annealing, the metal (such as copper) in die connectors 56 and the vias of the metallization pattern 128 diffuse to each other, so that metal-to-metal bonds are also formed. Hence, the resulting bonds between the IC dies 50 and the redistribution structure 112 are hybrid bonds. However, any suitable method may be used to attach the IC dies 50A and 50B to the redistribution structure 112.

In some embodiments, neighboring IC dies 50A and/or 50B are electrically coupled by electrical interconnects 138. In some embodiments, IC dies 50A and/or 50B located at larger distances from each other are electrically coupled by electrical interconnects 140.

Figure 5:
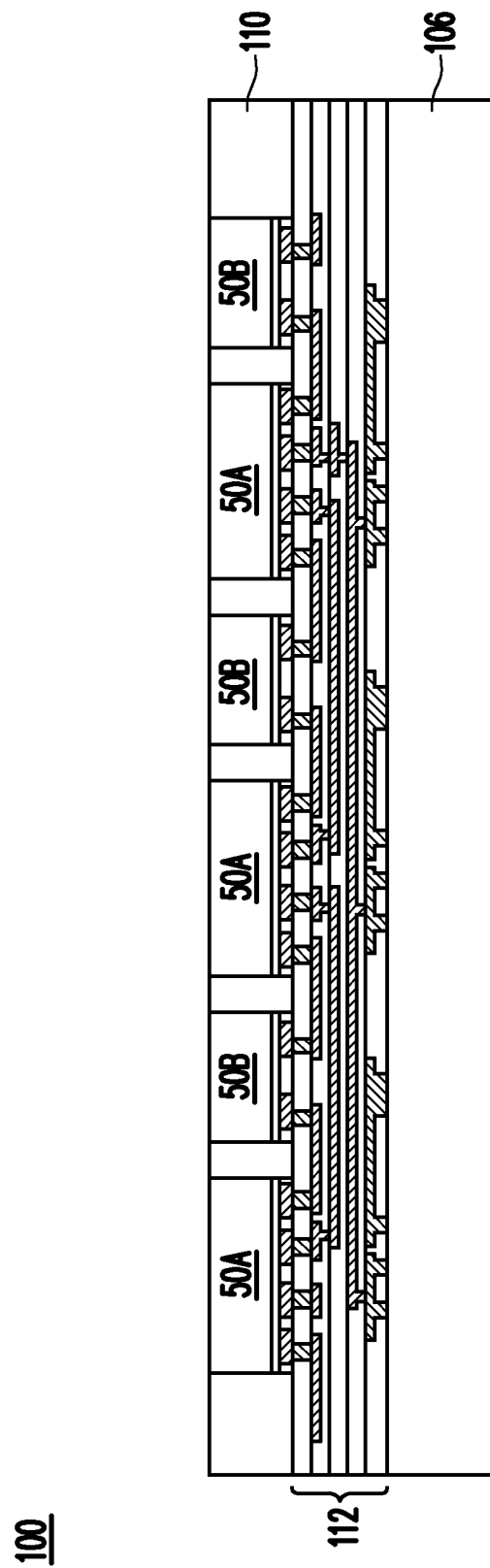

In FIG. 5, an encapsulant no is formed on and around the various components. After formation, the encapsulant no encapsulates the integrated circuit dies 50. The encapsulant no may be a molding compound, oxide, epoxy, or the like, and may be applied by compression molding, transfer molding, or the like. The encapsulant no may be applied in liquid or semi-liquid form and then subsequently cured. In some embodiments, the encapsulant no is formed over the wafer scale interposer 112 such that the integrated circuit dies 50 are buried or covered, and a planarization process is then performed on the encapsulant no to expose the topmost surfaces of the integrated circuit dies 50. The planarization process may be, for example, a grinding and/or a chemical-mechanical polish (CMP).

Figure 6:
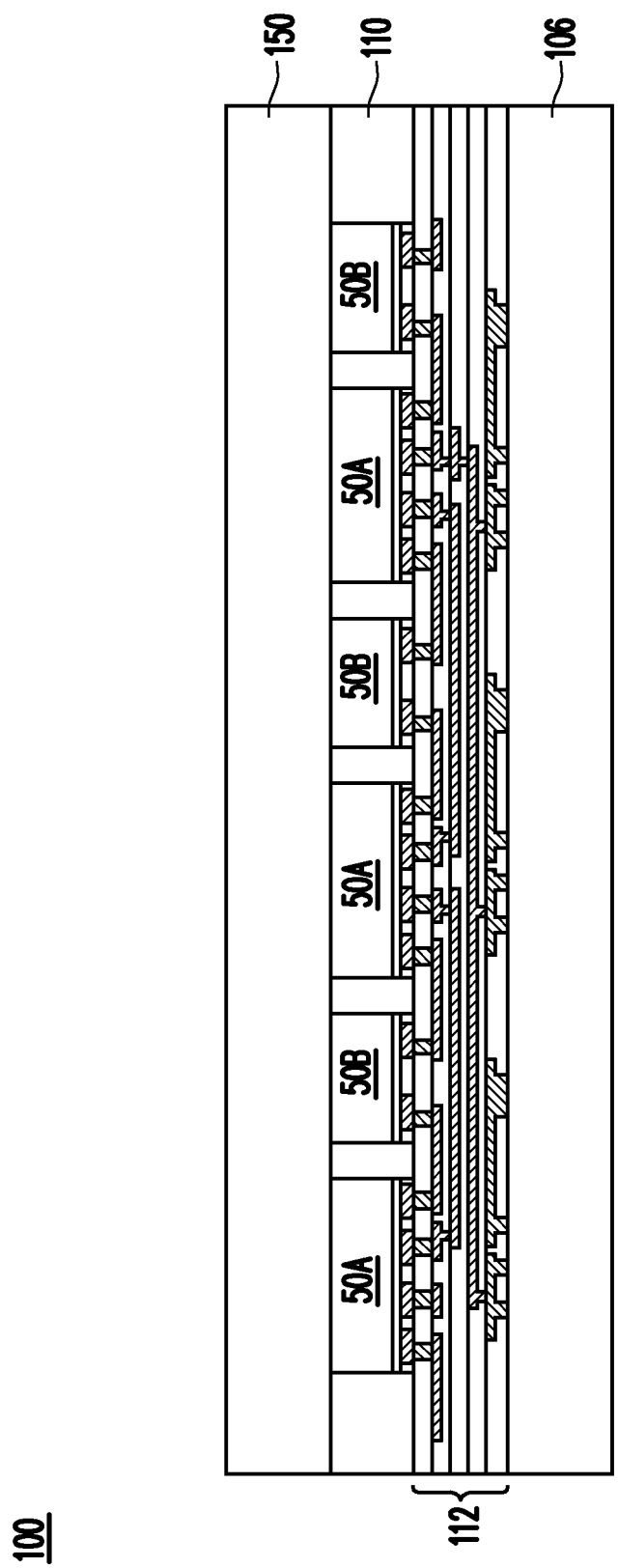

In FIG. 6, a dummy wafer 150 is attached to top surfaces of the encapsulant no and the IC dies 50. The dummy wafer 150 supports the wafer scale interposer 112 and the IC dies 50 in the system-on-wafer assembly 100. The dummy wafer 150 may be a semiconductor substrate, such as silicon, doped or undoped, or an active layer of a semiconductor-on-insulator (SOI) substrate. The semiconductor substrate may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as carrier substrates comprising e.g. glass or a ceramic material or multi-layered or gradient substrates, may also be used.

The dummy wafer 150 may be attached to top surfaces of the encapsulant 110 and the IC dies 50 with an adhesive such as an epoxy. The dummy wafer 150 may also be attached to top surfaces of the encapsulant no and the IC dies 50 by a bonding process such as wafer bonding. As an example, the encapsulant no and the semiconductor substrates 52 of the IC dies 50 are bonded to the dummy wafer 150 through dielectric-to-dielectric bonding, without using any adhesive material (e.g., die attach film). The bonding may include a pre-bonding and an annealing. During the pre-bonding, a small pressing force is applied to press the wafers against one another. The pre-bonding is performed at a low temperature, such as room temperature, and after the pre-bonding, the encapsulant no and the semiconductor substrates 52 are bonded to the dummy wafer 150. In some embodiments, an oxide, such as a native oxide, is formed at the back side of the semiconductor substrates 52 and/or the encapsulant 110 and is used for the bonding. The bonding strength is then improved in a subsequent annealing step, in which the dielectric layer 164 and the semiconductor substrate 52 are annealed at a high temperature. After the annealing, bonds, such as fusions bonds, are formed bonding the encapsulant no and the semiconductor substrates 52 with the dummy wafer 150. For example, the bonds can be covalent bonds between the encapsulant no and the dummy wafer 150 and between the semiconductor substrates 52 and the dummy wafer iso. However, any suitable adhesive or method of attachment may be used.

Figure 7:
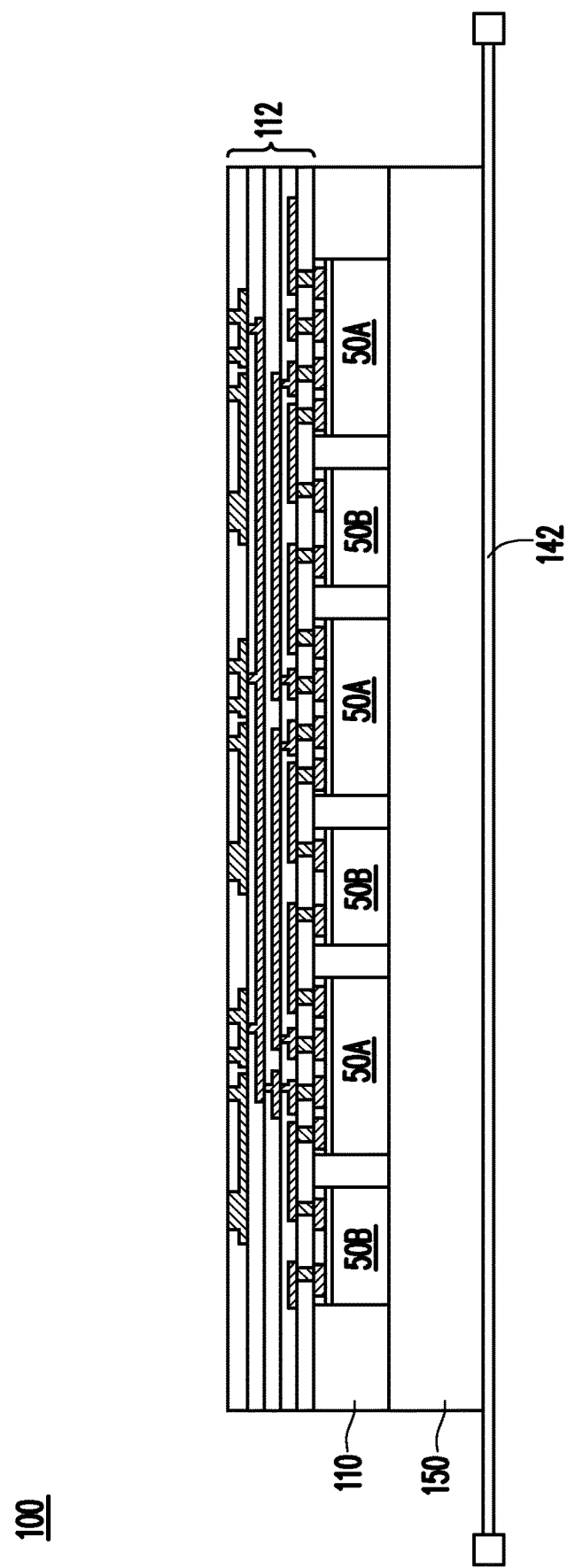

In FIG. 7, the wafer scale assembly 100 is flipped over and a substrate debonding is performed to detach (or "debond") the substrate 106 from the redistribution structure 112. In some embodiments, the debonding includes removing the substrate 106 by, e.g., a grinding or planarization process, such as a CMP. After removal, backside surfaces of the redistribution structure 112 are exposed. The structure is then placed on a tape 142.

Figure 8:
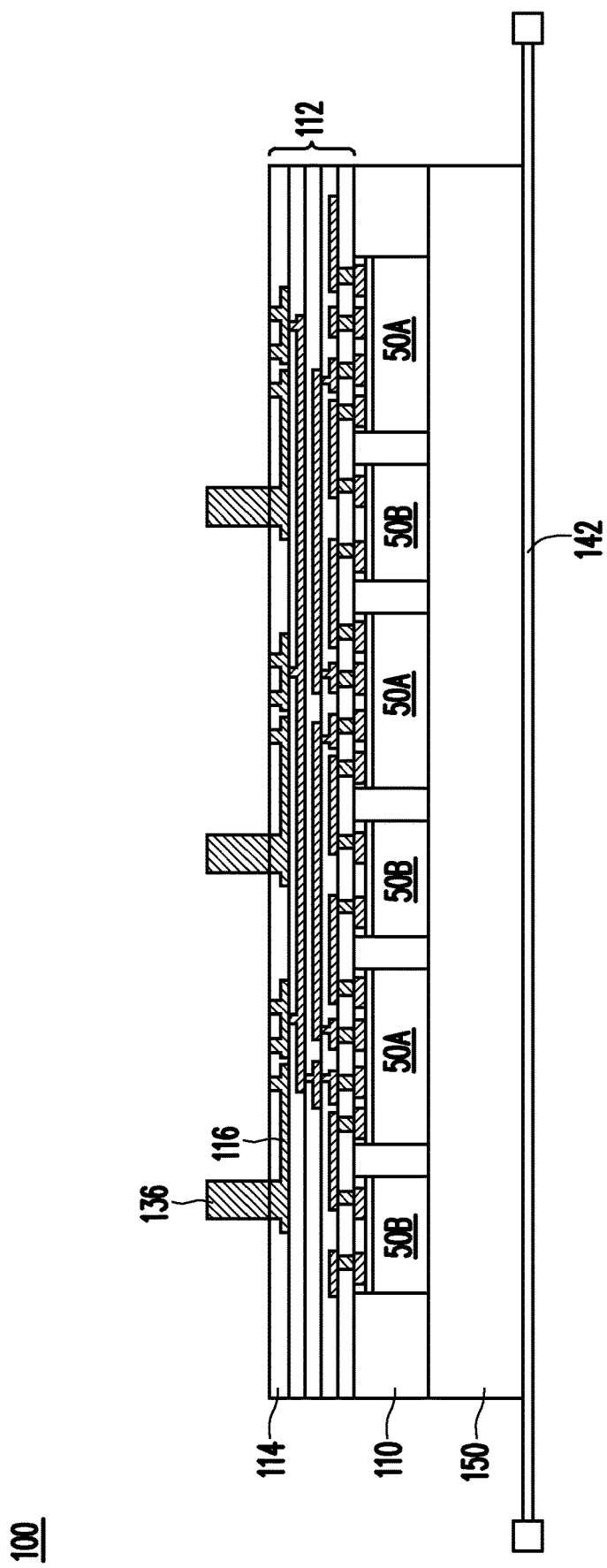

In FIG. 8, through vias 136, also referred to as through dielectric vias (TDVs) 136, are formed extending away from the topmost dielectric layer on the system signal and power I/O side of the redistribution structure 112. As an example to form the through vias 116, a seed layer (not shown) is formed over the redistribution structure 112, e.g., on the dielectric layer 114 and portions of the metallization pattern 116. In some embodiments, the seed layer is a metal layer, which may be a single layer or a composite layer comprising a plurality of sub-layers formed of different materials. In a particular embodiment, the seed layer comprises a titanium layer and a copper layer over the titanium layer. The seed layer may be formed using, for example, PVD or the like. A photoresist is formed and patterned on the seed layer. The photoresist may be formed by spin coating or the like and may be exposed to light for patterning. The pattern of the photoresist corresponds to conductive vias. The patterning forms openings through the photoresist to expose the seed layer. A conductive material is formed in the openings of the photoresist and on the exposed portions of the seed layer. The conductive material may be formed by plating, such as electroplating or electroless plating, or the like. The conductive material may comprise a metal, like copper, titanium, tungsten, aluminum, or the like. The photoresist and portions of the seed layer on which the conductive material is not formed are removed. The photoresist may be removed by an acceptable ashing or stripping process, such as using an oxygen plasma or the like. Once the photoresist is removed, exposed portions of the seed layer are removed, such as by using an acceptable etching process, such as by wet or dry etching. The remaining portions of the seed layer and conductive material form the through vias 136.

Figure 9:
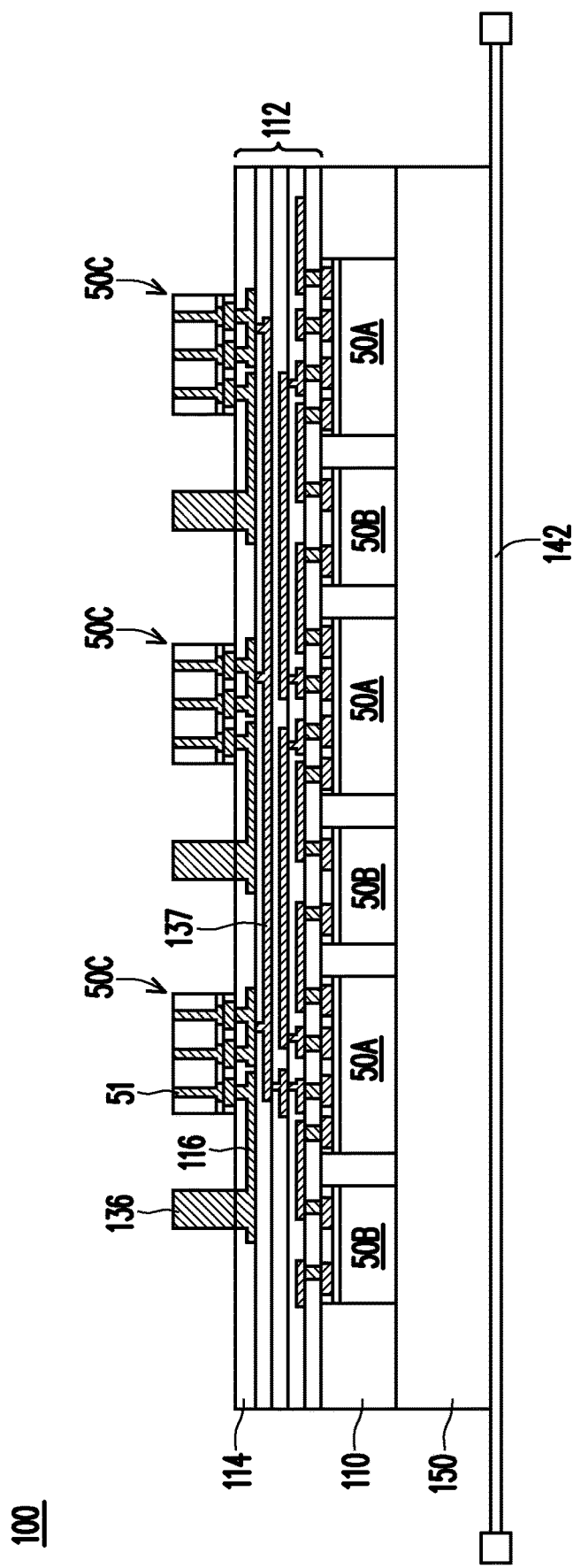

In FIG. 9, integrated circuit (IC) dies 50C, also referred to as IC dies 50, are attached to the redistribution structure 112 adjacent to the through vias 136. In some embodiments, the IC dies 50 comprise through substrate vias (TSVs) 51 extending to topmost surfaces of the IC dies 50. Known good dies (KGDs) may be used for the IC dies 50C to provide good system yield. In some embodiments, the IC dies 50C are one or more type of IC die such as, e.g. logic dies (e.g., central processing unit (CPU), graphics processing unit (GPU), system-on-a-chip (SoC), application processor (AP), microcontroller, etc.), memory dies (e.g., dynamic random access memory (DRAM) dies, static random access memory (SRAM) die, etc.), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), application-specific dies (e.g., an application-specific integrated circuit (ASIC), field-programmable gate array (FPGA), etc.), input/output (I/O) dies, integrated passive device (IPD) dies, or the like. The IC dies 50C may be of the same technology node, or of different technology nodes, from the IC dies 50A and 50B. For example, the IC dies 50A, and 50B, and 50C may include dies formed at a 10 nm technology node, dies formed at a 7 nm technology node, the like, or combinations thereof.

In some embodiments, the IC dies 50C are attached to the redistribution structure 112 using a suitable bonding method, such as e.g. metal-metal bonding including Cu—Cu bonding or Al—Al bonding, between the die connectors 56 of the IC dies 50C and the vias of the metallization pattern 116. In some embodiments, the IC dies 50C are attached to the redistribution structure 112 using hybrid bonds. However, any suitable method may be used to attach the IC dies 50C to the redistribution structure 112. In some embodiments, IC dies 50C are electrically coupled by electrical interconnects of the redistribution structure 112 to neighboring IC dies 50C or to IC dies 50 located at larger distances from each other. In some embodiments, IC dies 50C are electrically coupled by electrical interconnects 137 of the redistribution structure 112 to IC dies 50A or 50B located directly opposite the IC dies 50C across the redistribution structure 112 or to IC dies 50A or 50B located at larger distances from the IC dies 50C along a horizontal direction parallel to the dummy wafer 150's top surface. In some embodiments, the IC dies 50C are electrically coupled by electrical interconnects 137 of the redistribution structure 112 to adjacent TDVs 136.

Figure 10:
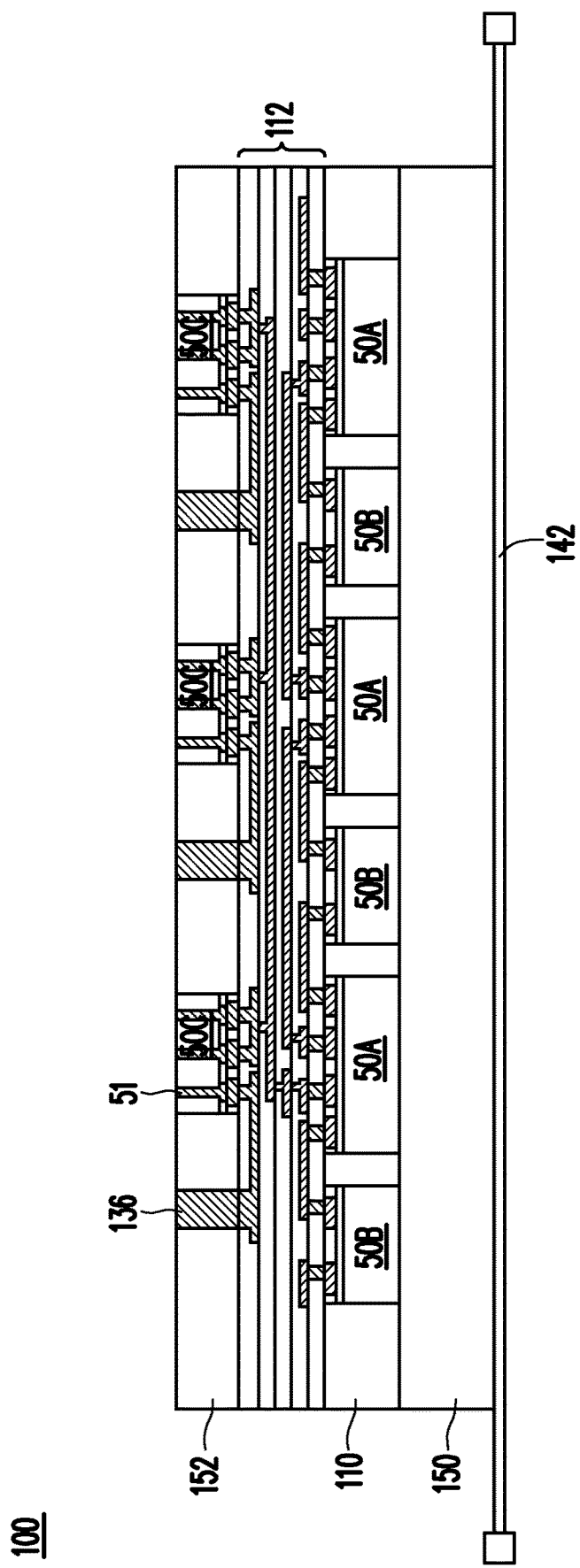

In FIG. 10, an encapsulant 152 is formed on and around the IC dies iso, the TDVs 136, and the surface of the redistribution structure 112 attached to the IC dies 150 and the TDVs 136. After formation, the encapsulant 150 encapsulates the integrated circuit dies 50C and the TDVs 136. The encapsulant no may be a molding compound, oxide, epoxy, or the like, and may be applied by compression molding, transfer molding, or the like. The encapsulant 152 may be applied in liquid or semi-liquid form and then subsequently cured. In some embodiments, the encapsulant 152 is formed over the wafer scale interposer 112 such that the integrated circuit dies 50C and the TDVs 136 are buried or covered, and a planarization process is then performed on the encapsulant 152 to expose the topmost surfaces of the integrated circuit dies 50C and the TDVs 136. The planarization process may be, for example, a grinding and/or a chemical-mechanical polish (CMP).

Figure 11:
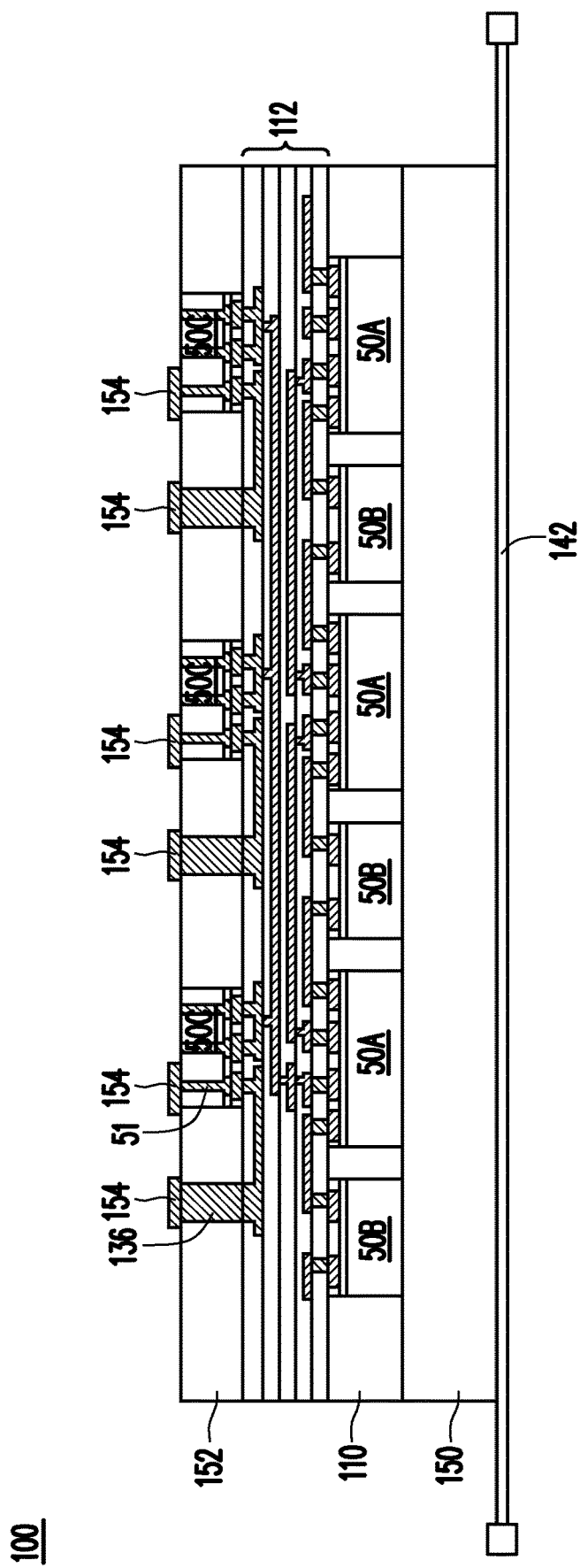

In FIG. 11, contact pads 154 are formed for external connection to the redistribution structure 112. The contact pads 154 are formed on top surfaces of the TDVs 136 and the TSVs 51. As a result, the contact pads 154 are electrically coupled to the IC dies 50C and to metallization lines in the redistribution structure 112. The contact pads 154 may be formed in a similar manner and of a similar material as the metallization patterns of the redistribution structure 112. The contact pads 154 comprise a conductive material such as copper, titanium, tungsten, aluminum, the like, or a combination thereof.

Figure 12A:
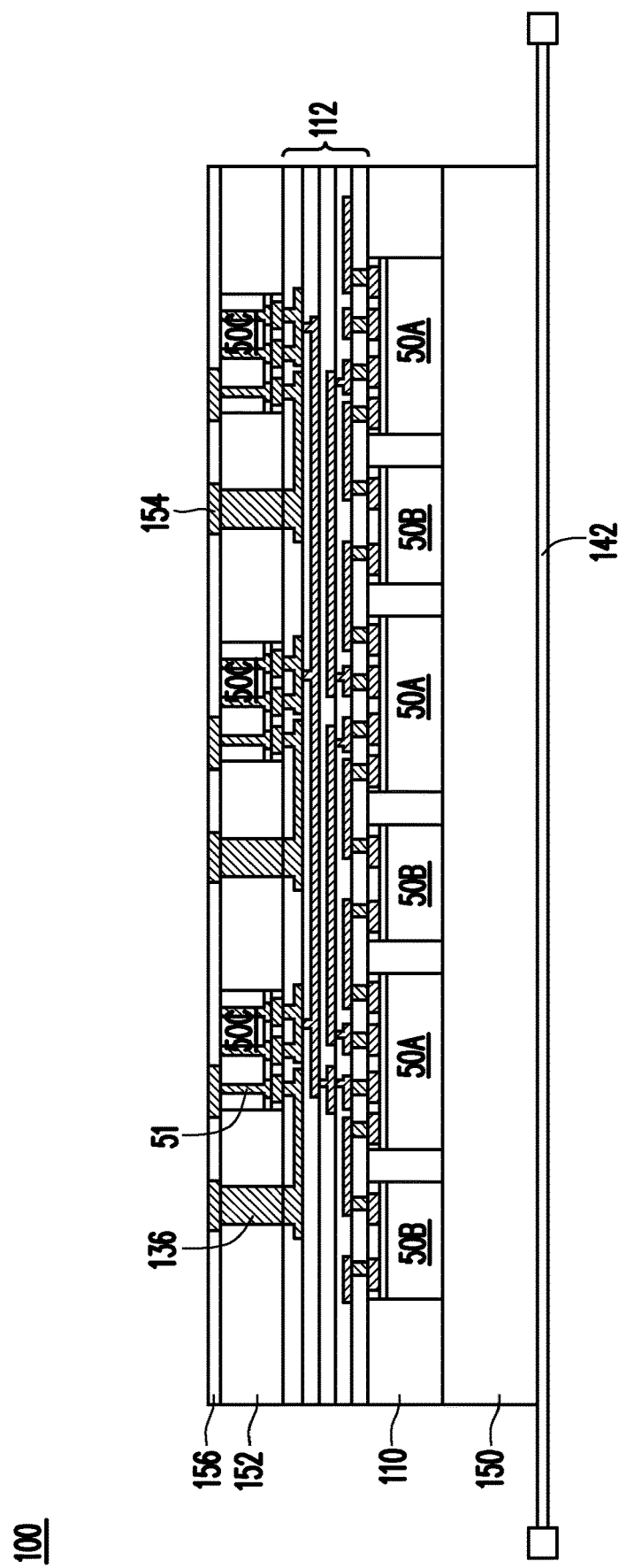

FIG. 12A illustrates a system-on-wafer assembly 100, in accordance with some embodiments. Following from FIG. 11, FIG. 12A shows a passivation layer 156 formed over top surfaces of the IC dies 50C and the encapsulant 152. The passivation layer 156 may be formed in a similar manner and of a similar material as the dielectric layer 114. However, any suitable method or materials may be used. The passivation layer 156 is patterned to form openings that expose top surfaces of the contact pads 154. The patterning of the passivation layer 156 may be performed by a similar lithographic method as the dielectric layer 114. However, any suitable method may be used for the patterning.

Figure 12B:
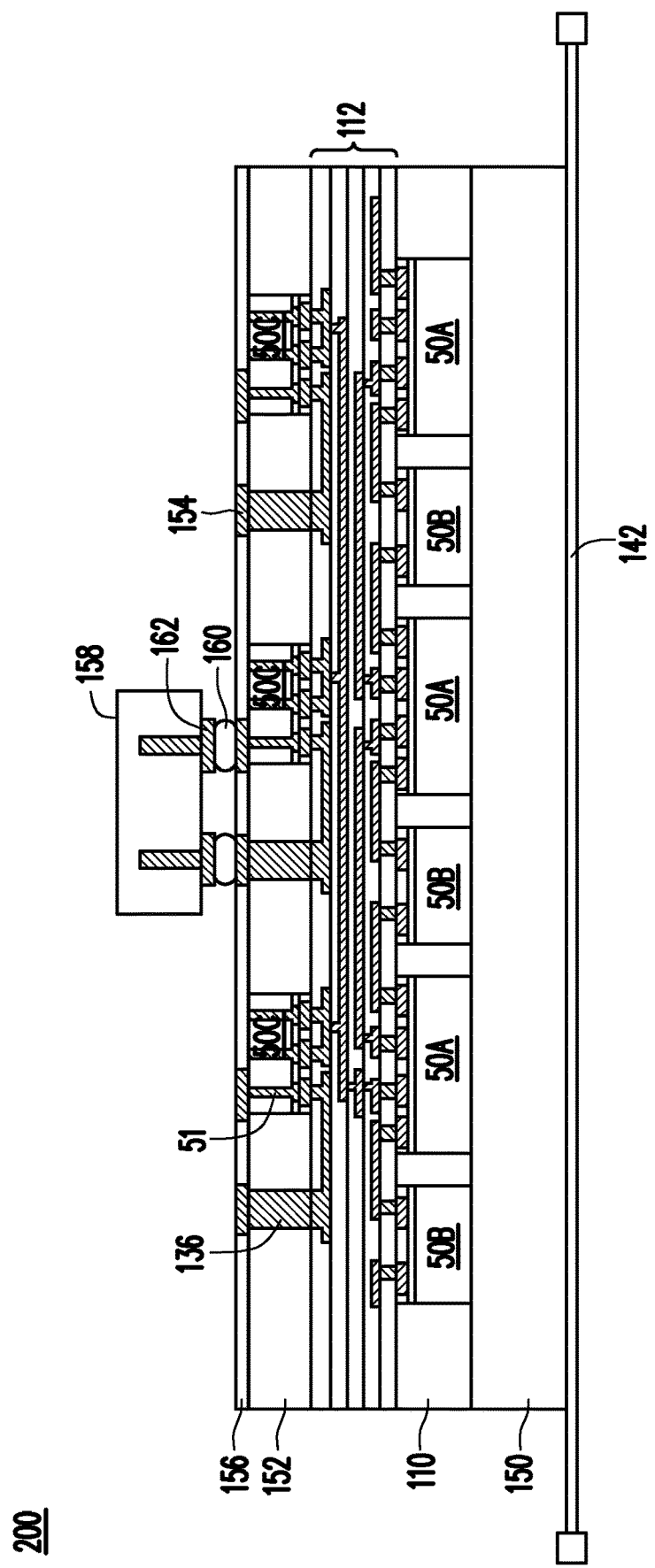
FIG. 12B illustrates a plan view of a system-on-wafer assembly, in accordance with some embodiments.

FIG. 12B illustrates an embodiment of a system-on-wafer assembly 200 with an external connector 158 attached. Although one external connector 158 is illustrated, multiple external connectors 158 may be attached to the system-on-wafer assembly 200. The system-on-wafer assembly 200 may be formed by substantially similar methods as the system-on-wafer assembly 100 as described above with respect to FIGS. 3 through 12A. The external connector 158 is coupled to the system-on-wafer assembly 200 by conductive connectors 146 formed on conductive pads 154 that are coupled to TSVs 136. The conductive connectors 146 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 146 may include a conductive material such as solder, copper, aluminum, gold, nickel, silver, palladium, tin, the like, or a combination thereof. In some embodiments, the conductive connectors 146 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Further referring to FIG. 12B, the external connectors 158 are attached to the system-on-wafer assembly 200 by the conductive connectors 160. Although one external connector 158 is illustrated, multiple external connectors 158 may be attached to the system-on-wafer assembly 200. The external connectors 158 are electrical and physical interfaces for the system-on-wafer assembly 100 to external systems. For example, when the system-on-wafer assembly 100 is installed as part of a larger external system, such as a data center, the external connectors 158 may be used to couple the system-on-wafer assembly 100 to the external system. Examples of external connectors 158 include optical connector modules, mechanical connector modules, receptors for ribbon cables, flexible printed circuits, or the like. The external connectors 158 include pads 162, which may be similar to (and have the same pitch as) the conductive pads 154. The external connectors 158 may include different components, such as a chassis, the pads 162, and external connection pins, which may comprise different materials. The pads 162 and conductive connectors 160 are used for physical and electrical connection to the interposers 150. Attaching the external connectors 158 may include placing the external connectors 158 on the system-on-wafer assembly 100 using, e.g., a pick-and-place technique, and then reflowing the conductive connectors 162 to physically and electrically couple the conductive pads 154 and pads 162.

Figure 12C:
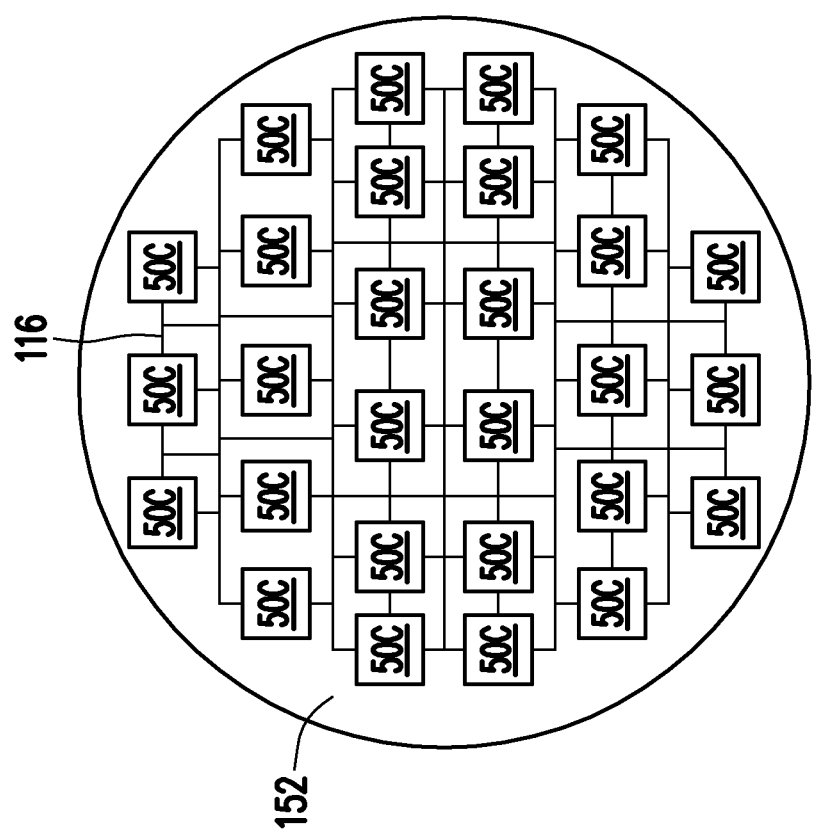
FIG. 12C illustrates a cross-sectional view of another system-on-wafer assembly, in accordance with some embodiments.

FIG. 12C illustrates a plan view of a system-on-wafer assembly similar to the system-on-wafer assembly 100 illustrated in FIG. 12A, in accordance with some embodiments. In some embodiments, the system-on-wafer assembly 100 has a round profile. In some embodiments, the system-on-wafer assembly 100 has a rectangular profile (not illustrated). An array of IC dies 50C are distributed across the system-on-wafer assembly 100. The encapsulant 152 is around the array of IC dies 50C. Electrical connections between the IC dies 50C are shown as metallization pattern 116, although the metallization pattern 116 may be located below the level of the IC dies 50C in some embodiments.

Figure 12D:
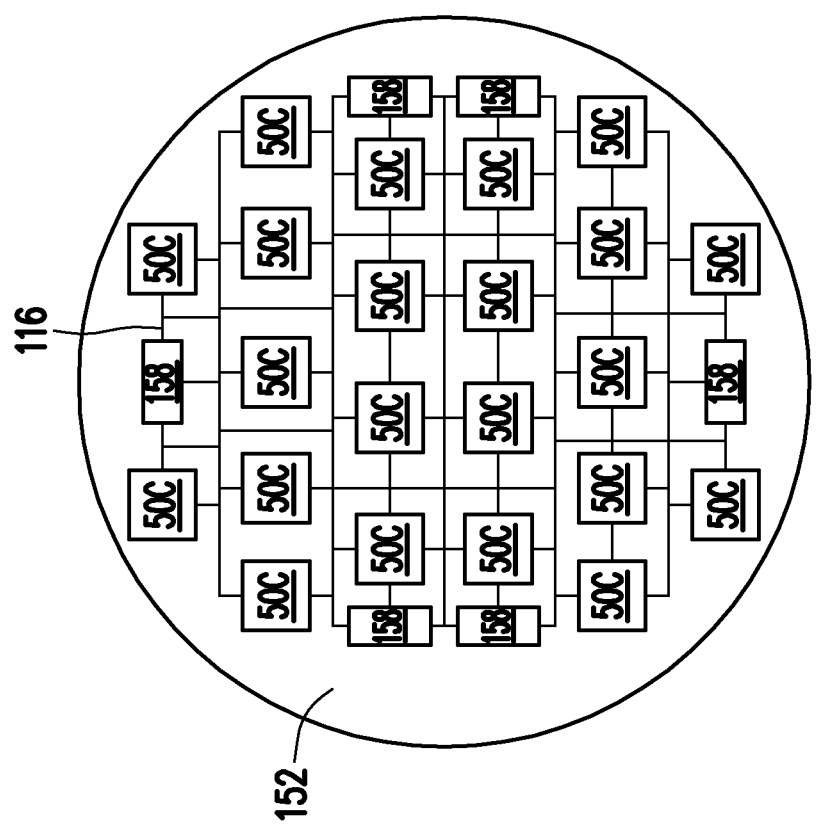
FIG. 12D illustrates a plan view of another system-on-wafer assembly, in accordance with some embodiments.

FIG. 12D illustrates a plan view of a system-on-wafer assembly similar to the system-on-wafer assembly 200 illustrated in FIG. 12B, in accordance with some embodiments. Some of the IC dies 50C distributed across the system-on-wafer assembly 100 as shown in FIG. 12C are replaced with external connectors 158 in the system-on-wafer assembly 200, although the external connectors may be located above the level of IC dies 50C in some embodiments. Electrical connections between the IC dies 50C and the external connectors 158 are shown as metallization pattern 116, although the metallization pattern 116 may be located below the level of the IC dies 50C in some embodiments.

FIGS. 13 through 21 illustrate cross-sectional view of intermediate steps in the fabrication of a system-on-wafer assembly 300 with multiple tiers of IC dies 50, in accordance with some embodiments. The fabrication of the system-on-wafer assembly 300 may be substantially similar to the fabrication of the system-on-wafer assembly as described above in reference to FIGS. 2 through 12A, but with multiple tiers of IC dies 50 assembled.

Figure 13:
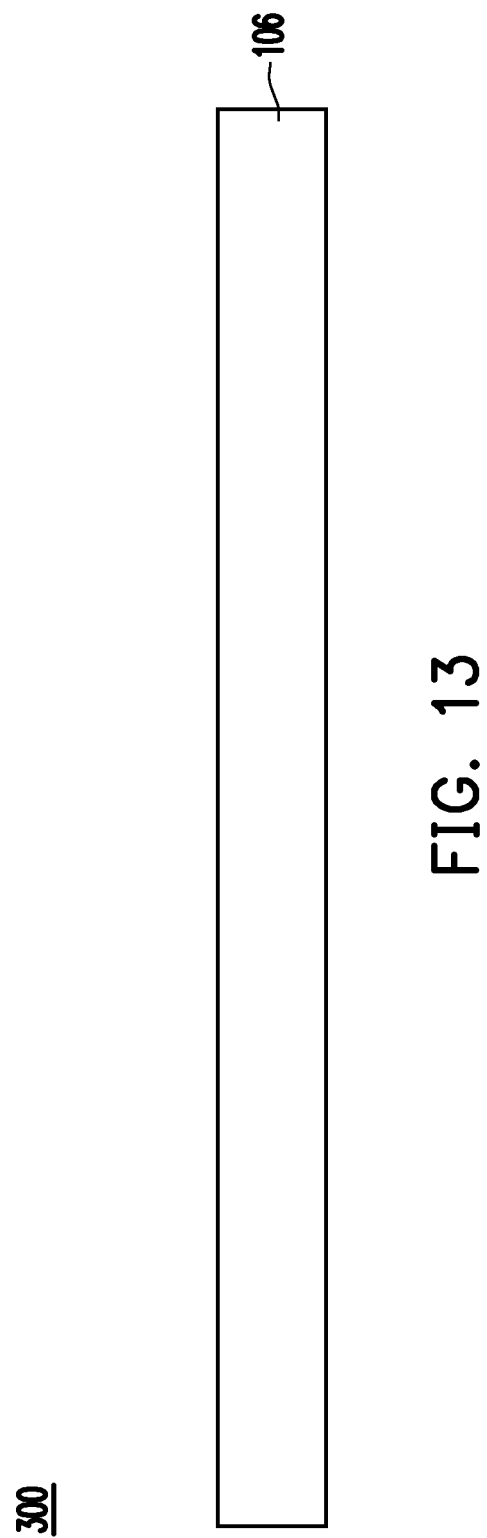
FIGS. 13-20 illustrate cross-sectional views of intermediate steps during a process for forming yet another system-on-wafer assembly, in accordance with some embodiments.

FIG. 13 illustrates the substrate 106. The substrate 106 was previously described above in reference to FIG. 2 and the description is not repeated herein.

Figure 14:
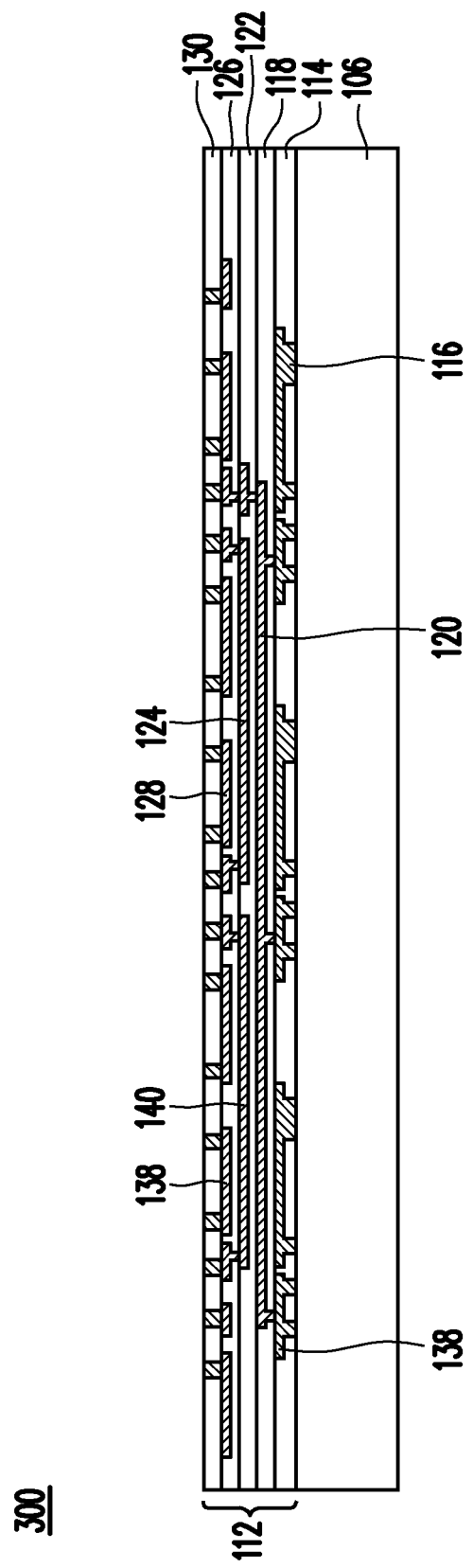

FIG. 14 illustrates the redistribution structure 112 formed over the substrate 106. The redistribution structure 112 was previously described above in reference to FIG. 3 and the description is not repeated herein.

Figure 15:
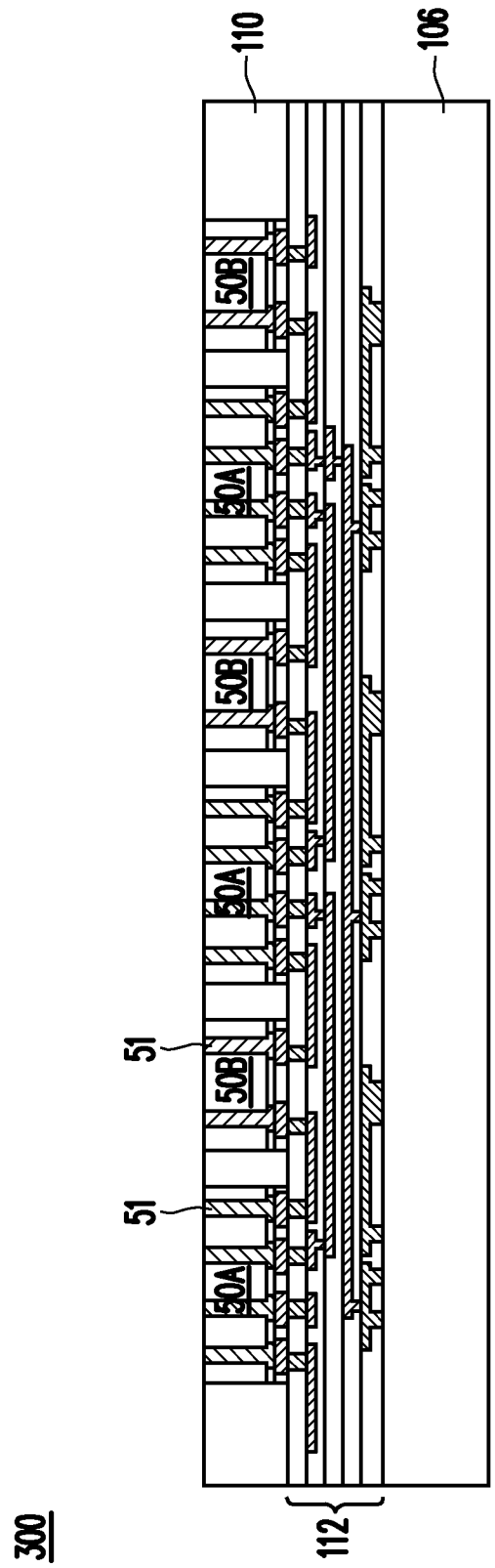

FIG. 15 illustrates a first tier of IC dies 50A and 50B attached to the redistribution structure 112 and the encapsulant 110 formed on and around the various components. In some embodiments, the IC dies 50A and 50B comprise through substrate vias (TSVs) 51 extending to topmost surfaces of the IC dies 50A and 50B. The IC dies 50A and 50B and the encapsulant no were previously described above in reference to FIGS. 4 and 5, respectively, and the descriptions are not repeated herein.

Figure 16:
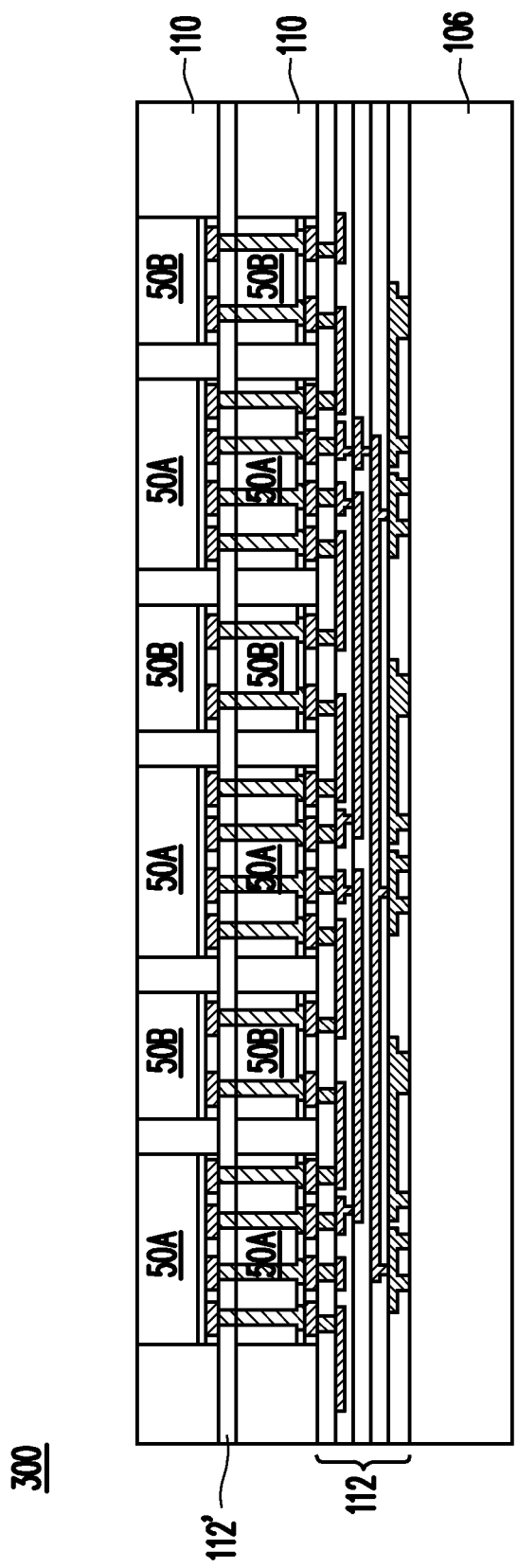

FIG. 16 illustrates the formation of an additional redistribution structure 112' over the back side of the first tier of IC dies 50A and 50B and the formation of a second tier of IC dies 50A and 50B and encapsulant no to the additional redistribution structure 112'. Although FIG. 16 illustrates two tiers of IC dies 50A and 50B with one additional redistribution structure 112', in some embodiments more tiers of the IC dies 50A and 50B and additional redistribution structures 112' between each tier may be present. The additional redistribution structure 112' may be formed by substantially similar methods as the redistribution structure 112, as described above with respect to FIG. 3. The additional redistribution structure 112' may electrically couple through substrate vias (TSVs) 51 within the IC dies 50A and 50B to die connectors 56 of the IC dies 50A and 50B in vertically adjacent tiers.

In some embodiments, the additional redistribution structure 112' may be omitted and the IC dies 50A and 50B may be directly bonded, such as by hybrid bonds including metal-metal bonds between the TSVs 51 and the die connectors 56 and fusion bonding between the semiconductor substrates 52 and the dielectric layers 58 of the stacked IC dies 50A and 50B in adjacent tiers.

Figure 17:
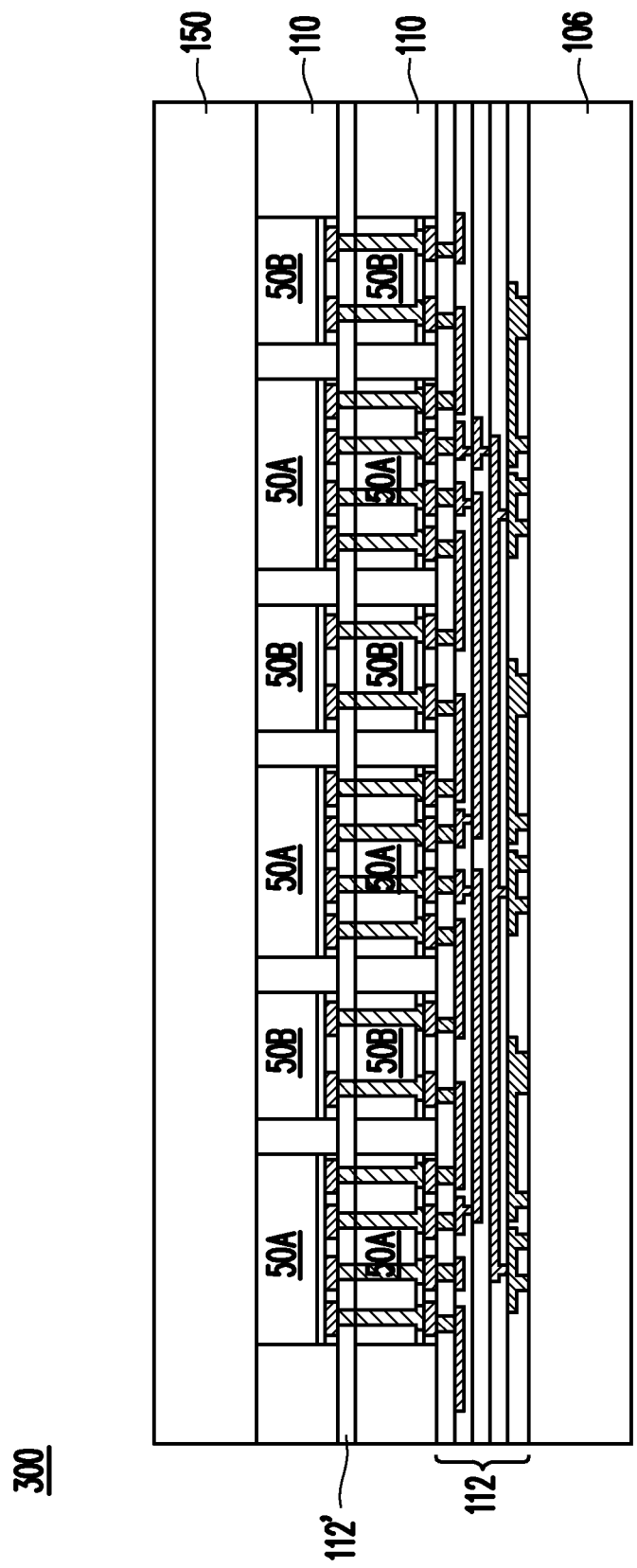

FIG. 17 illustrates a dummy wafer 150 attached to top surfaces of the encapsulant no and the IC dies 50. The dummy wafer 150 was previously described above in reference to FIG. 6 and the description is not repeated herein.

Figure 18:
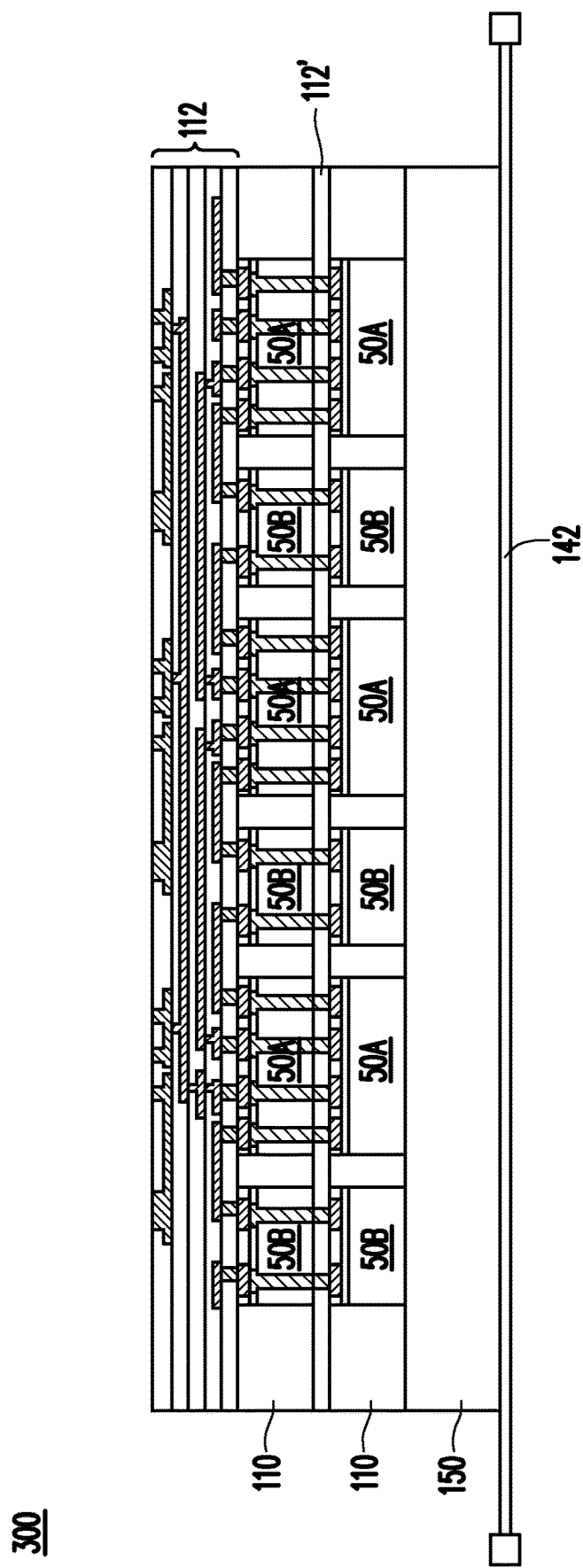

FIG. 18 illustrates the wafer scale assembly 500 flipped over and placed on a tape 142 and the detachment of the substrate 106 from the redistribution structure 112. The detachment of the substrate 106 was previously described above in reference to FIG. 7 and the description is not repeated herein.

Figure 19:
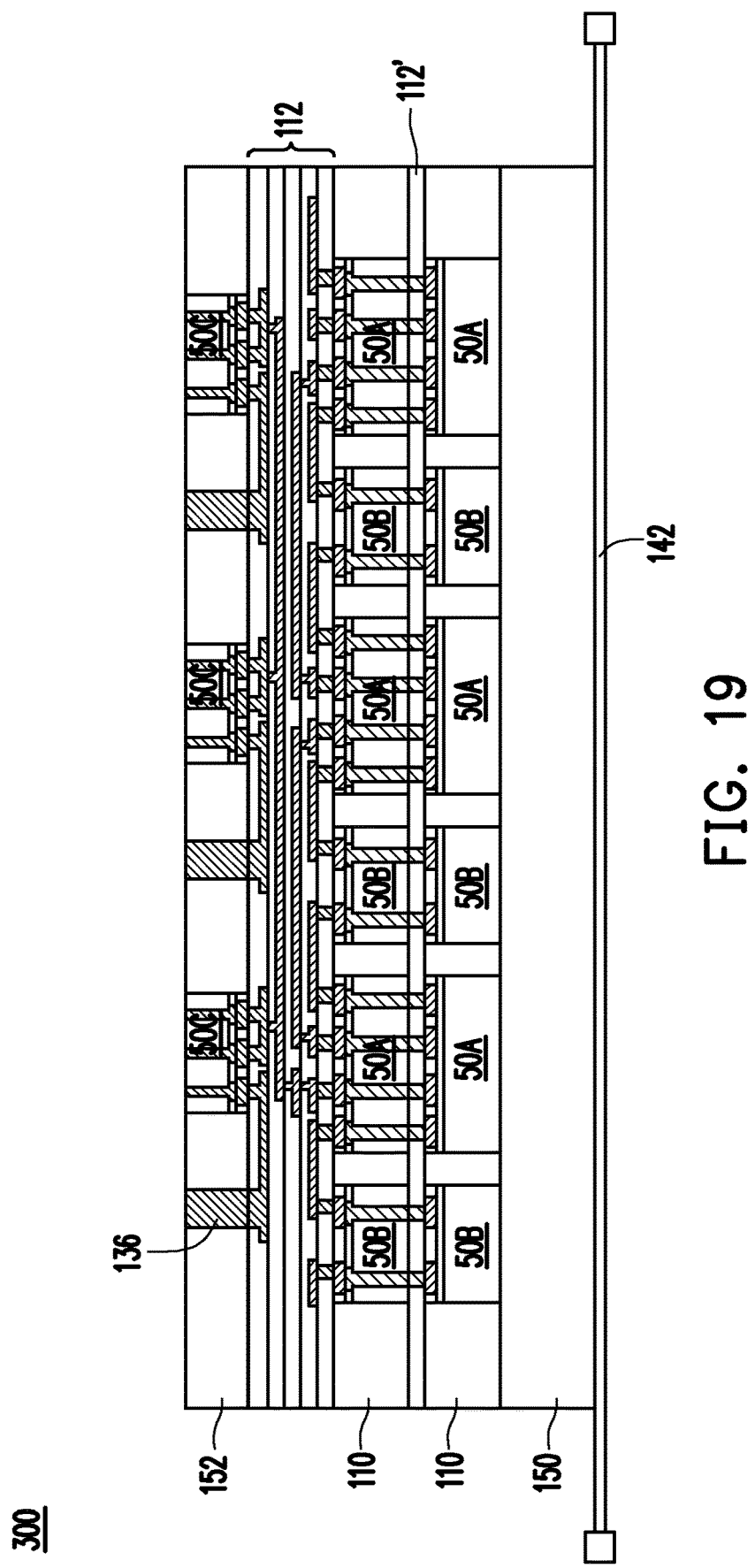

FIG. 19 illustrates a first tier of TDVs 136 formed on the redistribution structure 112, IC dies 50C attached to the redistribution structure 112, and an encapsulant 152 formed on and around the various components. The TDVs 136, the IC dies 50C, and the encapsulant 152 were previously described above in reference to FIGS. 8, 9, and 10, respectively, and the descriptions are not repeated herein.

Figure 20:
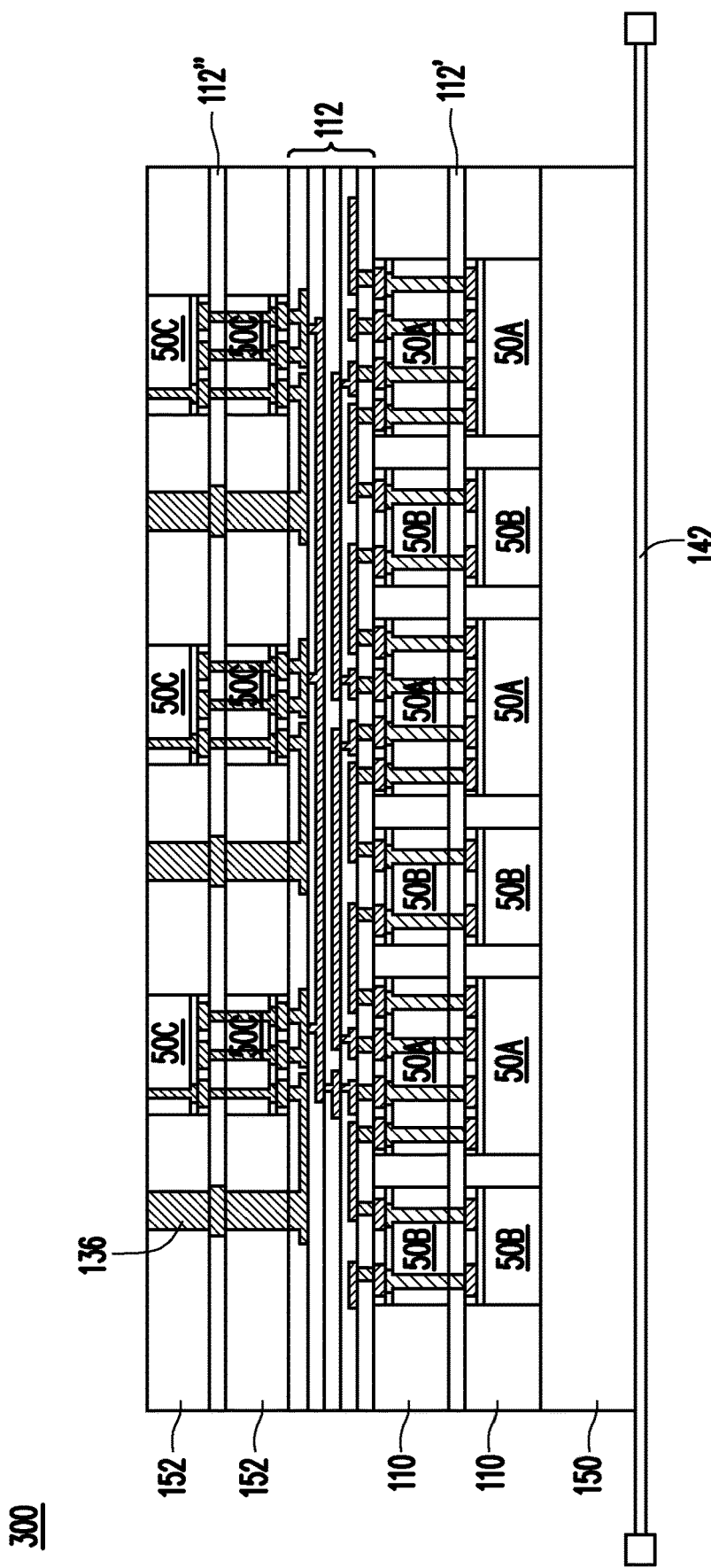

FIG. 20 illustrates the formation of an additional redistribution structure 112" over the back side of the first tier of TDVs 136 and IC dies 50C and the attachment of a second tier of TDVs 136, IC dies 50C, and encapsulant 152 to the additional redistribution structure 112". Although FIG. 20 illustrates two tiers of TDVs 136 and IC dies 50C with one additional redistribution structure 112", in some embodiments more tiers of the TDVs 136 and IC dies 50C and additional redistribution structures 112" between each tier may be present. The additional redistribution structure 112" may be formed by substantially similar methods as the redistribution structure 112, as described above with respect to FIG. 3. The additional redistribution structure 112" may electrically couple TSVs 51 within the IC dies 50C to die connectors 56 of the IC dies 50C in vertically adjacent tiers and may further couple vertically adjacent TDVs 136 in vertically adjacent tiers to each other.

In some embodiments, the additional redistribution structure 112" may be omitted and the IC dies 50C may be directly bonded, such as by hybrid bonds including metal-metal bonds between the TDVs 136 and the die connectors 56 and fusion bonding between the semiconductor substrates 52 and the dielectric layers 58 of the stacked IC dies 50C in adjacent tiers. The TDVs 136 of the second tier may be formed directly on top surfaces of the TDVs 136 of the first tier.

Figure 21:
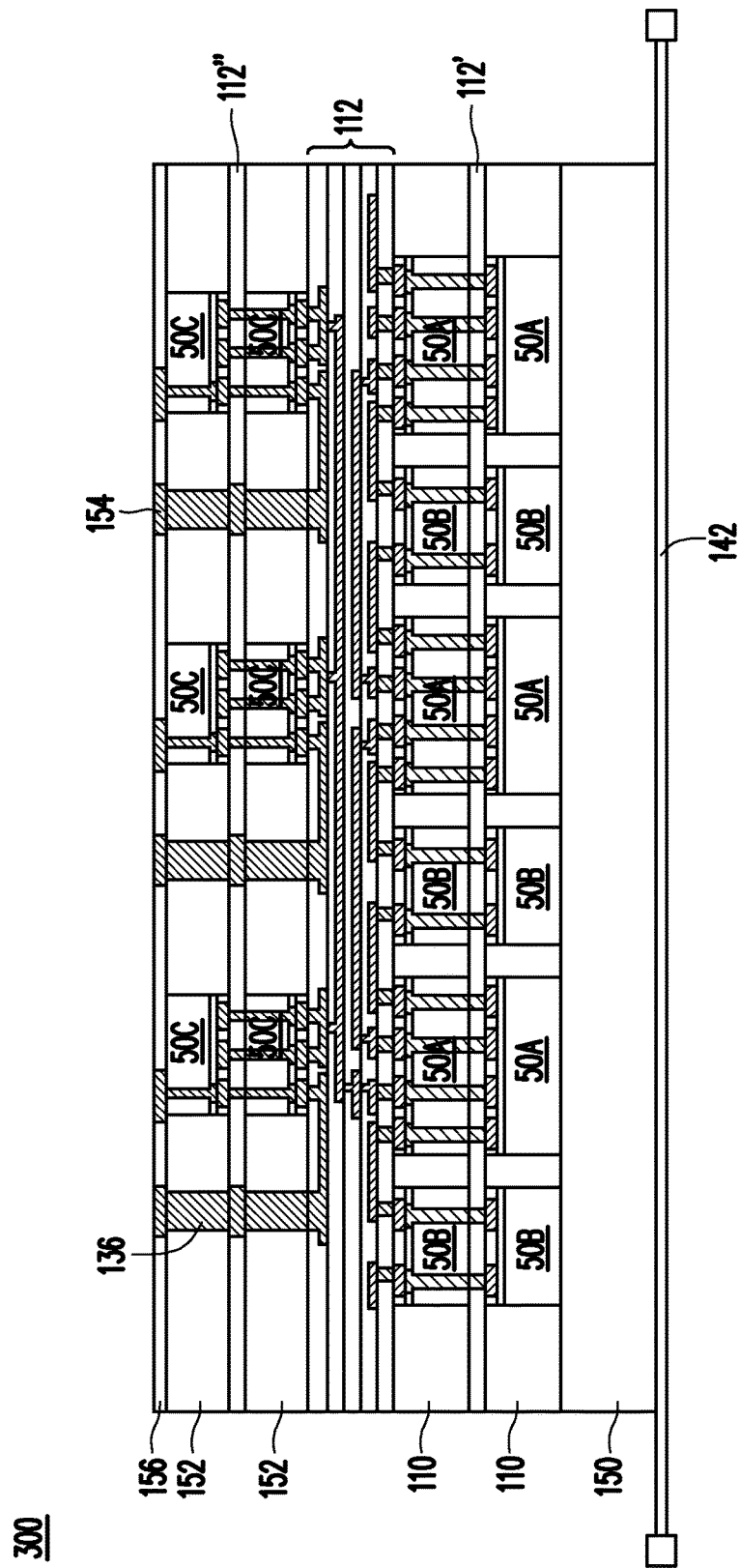
FIG. 21 illustrates a cross-sectional view of yet another system-on-wafer assembly, in accordance with some embodiments.

FIG. 21 illustrates the system-on-wafer assembly 500 with contact pads 154 formed for external connection and a passivation layer 156 formed over top surfaces of the IC dies 50C and the encapsulant 152, in accordance with some embodiments. The contact pads 154 and the passivation layer 156 were previously described above in reference to FIGS. 11 and 12, respectively, and the descriptions are not repeated herein.

Figure 22:
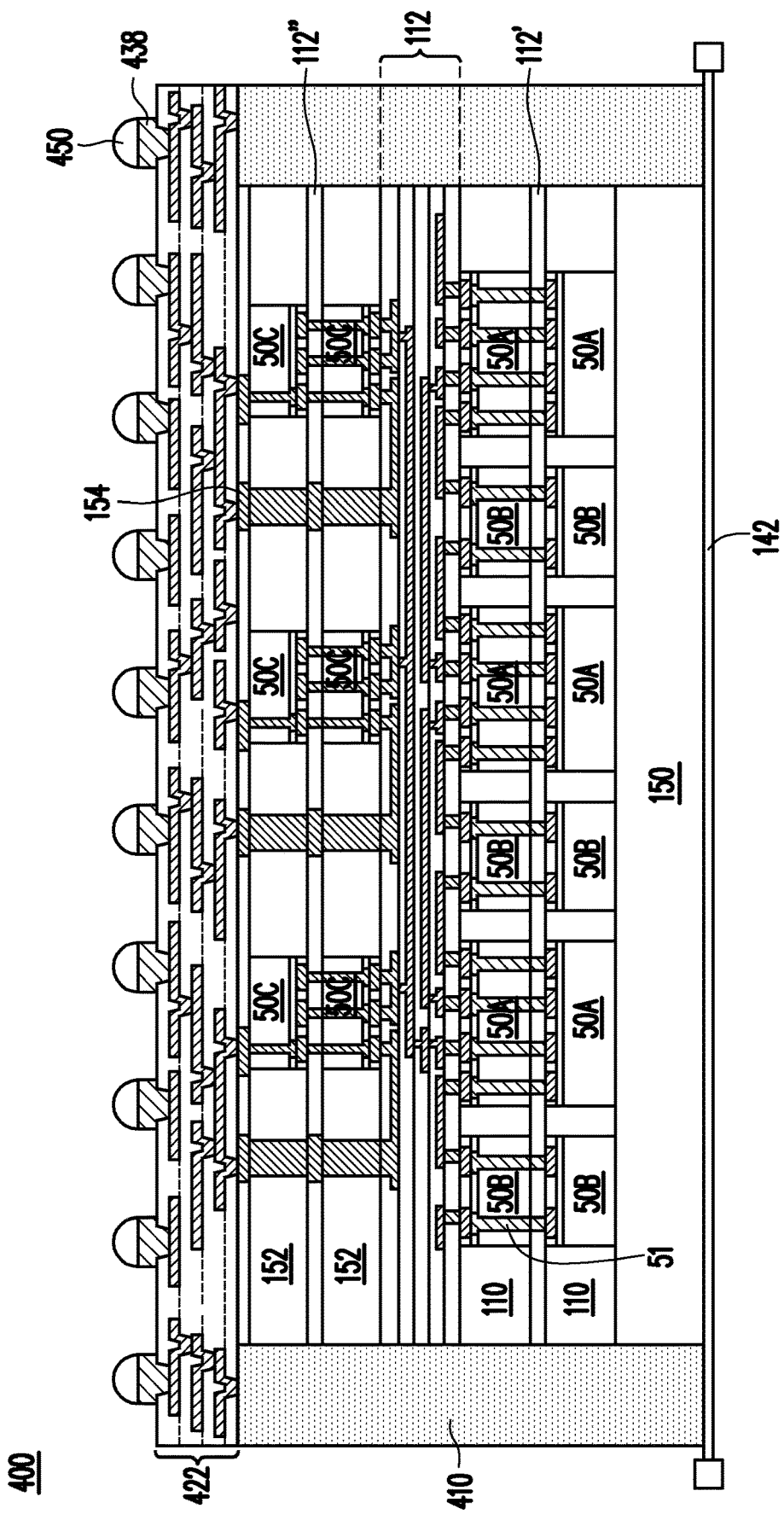
FIG. 22 illustrates a cross-sectional view of an integrated fan-out package, in accordance with some embodiments.

FIG. 22 illustrates a cross-sectional view of an integrated fan-out (InFO) package 400 comprising the system-on-wafer assembly 300, in accordance with some embodiments. The InFO package 400 is formed by encapsulating the system-on-wafer assembly 300 with an encapsulant 410 with a substantially similar process and materials as the encapsulant no as described above with reference to FIG. 5. A front-side redistribution structure 422 is formed on the system-on-wafer assembly 300 and the encapsulant 410. The front-side redistribution structure 422 may be formed by substantially similar methods using substantially similar materials as the redistribution structure 112 as described above with respect to FIG. 3.

Still referring to FIG. 22, UBMs 438 are formed for external connection to the front-side redistribution structure 422. The UBMs 438 have bump portions on and extending along the major surface of the top dielectric layer of the front-side redistribution structure 422, and have via portions extending through the top dielectric layer to physically and electrically couple the top metallization pattern of the front-side redistribution structure 422. As a result, the UBMs 438 are electrically coupled to the TSVs 136 and the IC dies 50C. The UBMs 438 may be formed of the same material as the metallization patterns of the redistribution structure 112.

Further referring to FIG. 22, conductive connectors 450 are formed on the UBMs 438. The conductive connectors 450 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 450 may include a conductive material such as solder, copper, aluminum, gold, nickel, silver, palladium, tin, the like, or a combination thereof. In some embodiments, the conductive connectors 450 are formed by initially forming a layer of solder through evaporation, electroplating, printing, solder transfer, ball placement, or the like. Once a layer of solder has been formed on the structure, a reflow may be performed in order to shape the material into the desired bump shapes. In another embodiment, the conductive connectors 450 comprise metal pillars (such as a copper pillar) formed by sputtering, printing, electro plating, electroless plating, CVD, or the like. The metal pillars may be solder free and have substantially vertical sidewalls. In some embodiments, a metal cap layer is formed on the top of the metal pillars. The metal cap layer may include nickel, tin, tin-lead, gold, silver, palladium, indium, nickel-palladium-gold, nickel-gold, the like, or a combination thereof and may be formed by a plating process.

Figure 23:
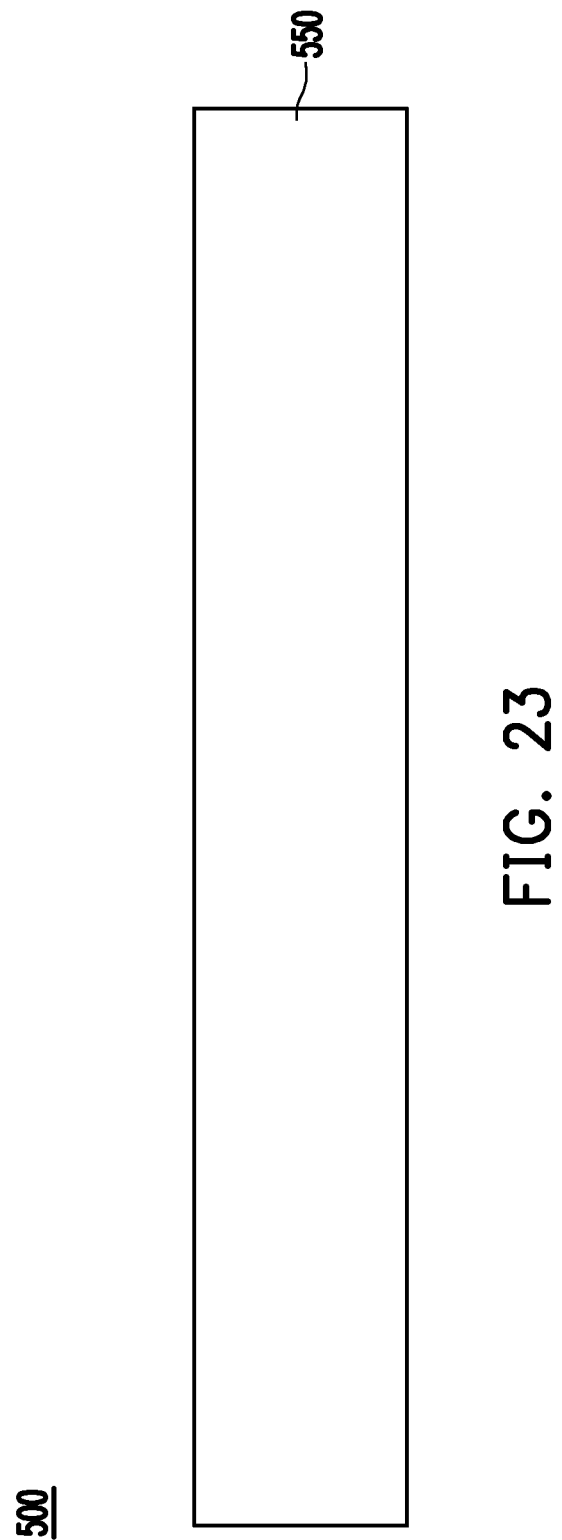
Figure 24:
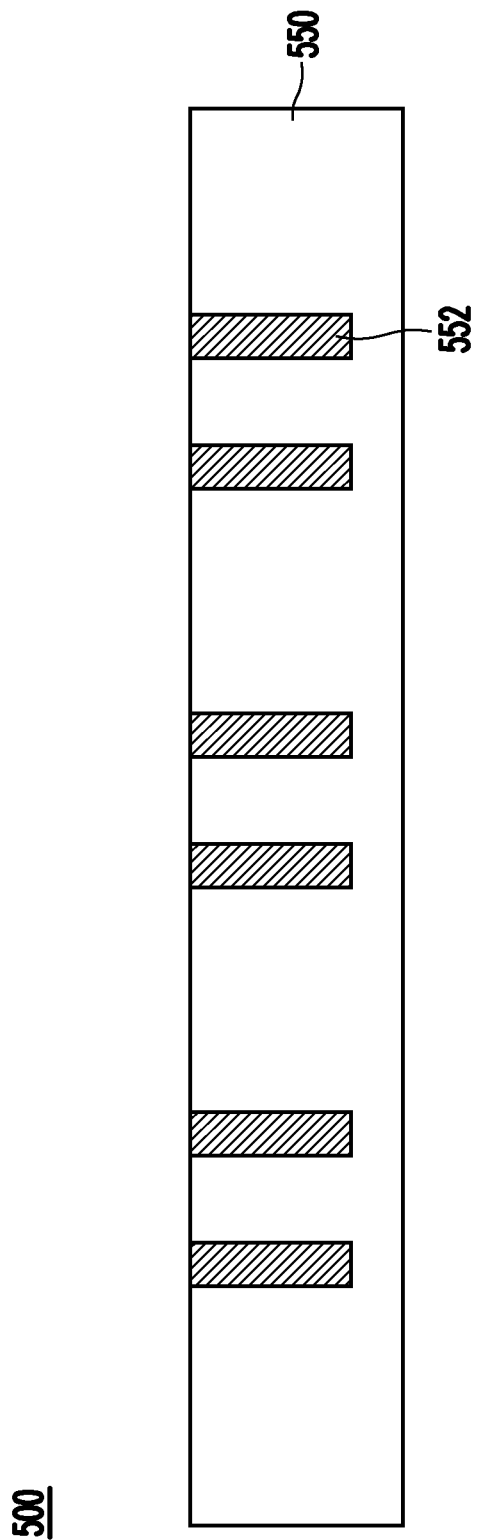

FIGS. 23-24B illustrate cross-sectional views of intermediate steps during a process for forming a system-on-wafer assembly 500 with dies bonded to one side of a wafer scale interposer, in accordance with some embodiments. In FIG. 23, a substrate 550, also referred to as an interposer 550, is provided. The substrate 550 may be a wafer, such as silicon, doped or undoped, or an active layer of a semiconductor-on-insulator (SOI) substrate. The substrate 550 may include other semiconductor materials, such as germanium; a compound semiconductor including silicon carbide, gallium arsenic, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. Other substrates, such as multi-layered or gradient substrates, may also be used. The substrate 550 has an active surface (e.g., the surface facing upwards in FIG. 23), sometimes called a front side, and an inactive surface (e.g., the surface facing downwards in FIG. 23), sometimes called a back side.

In FIG. 24, conductive vias 552 are formed extending into the substrate 550. The conductive vias 552 will subsequently be electrically coupled to metallization patterns of the subsequently formed redistribution structure 512 (see below, FIG. 25). As an example to form the conductive vias 552, recesses can be formed in the substrate 559 by, for example, etching, milling, laser techniques, a combination thereof, and/or the like. A thin dielectric material may be formed in the recesses, such as by using an oxidation technique. A barrier layer (not illustrated) may be conformally deposited in the openings, such as by CVD, atomic layer deposition (ALD), physical vapor deposition (PVD), thermal oxidation, a combination thereof, and/or the like. The barrier layer may be formed from an oxide, a nitride, or an oxynitride, such as titanium nitride, titanium oxynitride, tantalum nitride, tantalum oxynitride, tungsten nitride, a combination thereof, and/or the like. A conductive material may be deposited over the barrier layer and in the openings. The conductive material may be formed by an electro-chemical plating process, CVD, PVD, a combination thereof, and/or the like. Examples of conductive materials are copper, tungsten, aluminum, silver, gold, a combination thereof, and/or the like. Excess of the conductive material and the barrier layer is removed from the surface of the substrate 550 by, for example, a chemical-mechanical polish (CMP). Remaining portions of the barrier layer and the conductive material form the conductive vias 552.

In the embodiment illustrated, the conductive vias 552 are not yet exposed at the back side of the system-on-wafer assembly 500. Rather, the conductive vias 552 are buried in the substrate 550. As will be discussed in greater detail below, the conductive vias 552 will be exposed at the back side of the system-on-wafer assembly 500 in subsequent processing. After exposure, the conductive vias 552 can be referred to as through-silicon vias or through-substrate vias (TSVs).

Figure 25:
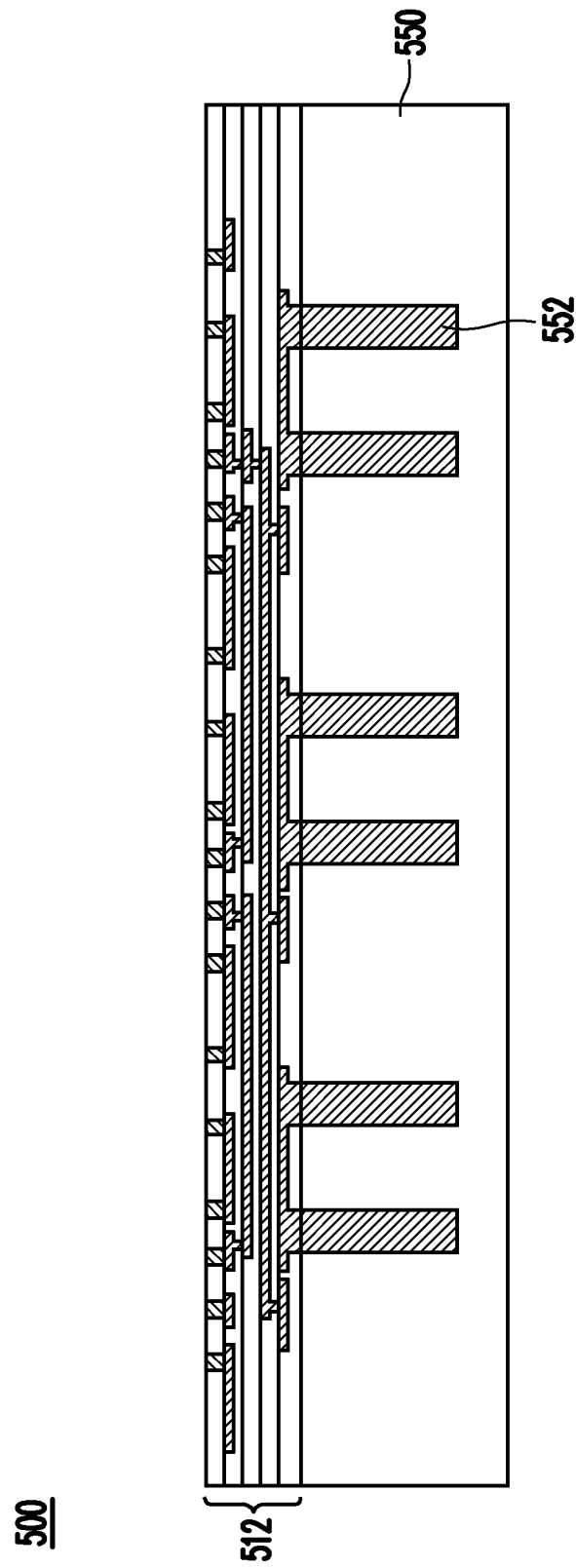

In FIG. 25, a redistribution structure 512, also referred to as a wafer scale interposer 512, is formed over the substrate 550. The redistribution structure 512 comprises back end of line (BEOL) layers including metallization patterns and dielectric layers. The metallization patterns may also be referred to as redistribution layers or redistribution lines. The redistribution structure 512 is shown as an example having five layers of metallization patterns. More or fewer dielectric layers and metallization patterns may be formed in the redistribution structure 512. The redistribution structure 512 may be formed with substantially similar methods and materials as the redistribution structure 112 as described above in reference to FIG. 3. Conductive vias of the metallization patterns of the redistribution structure 112 are electrically coupled to the conductive vias 552.

Figure 26:
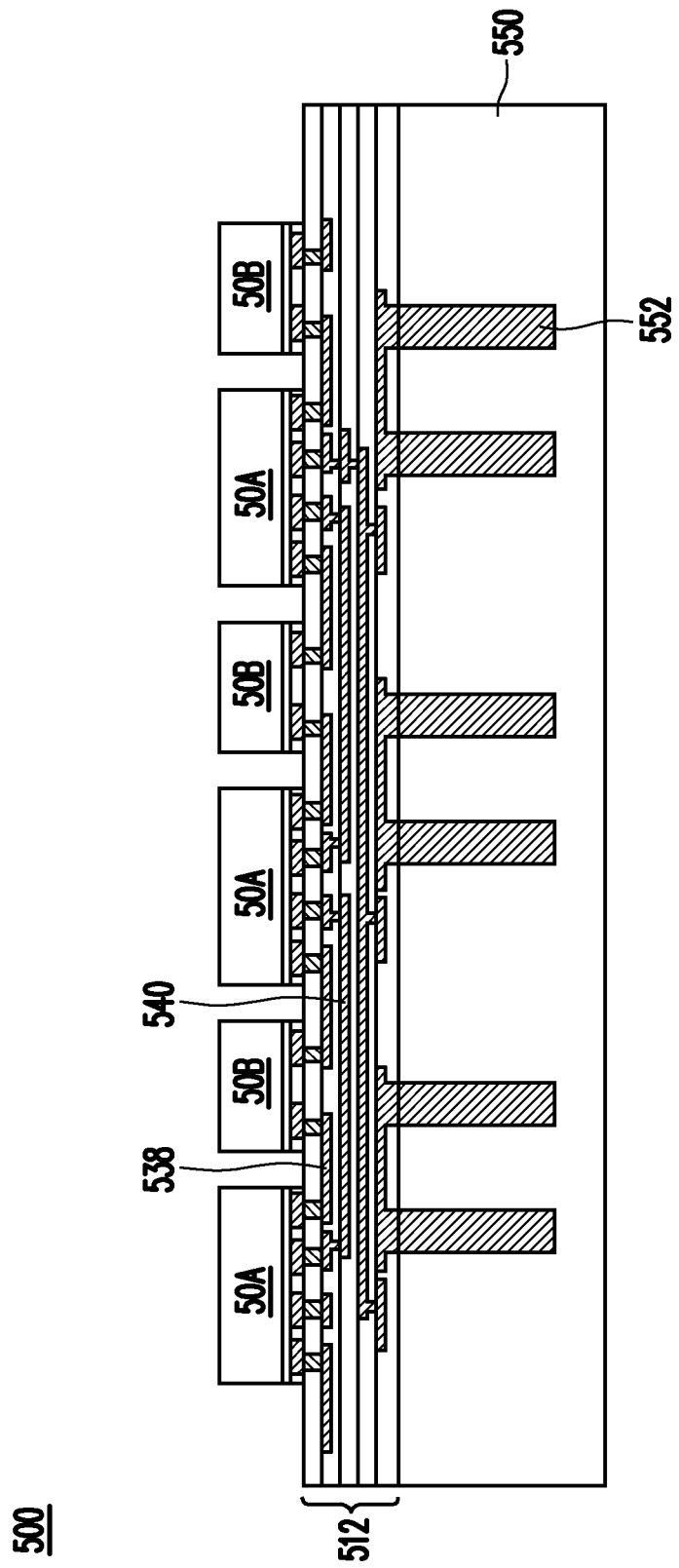

In FIG. 26, integrated circuit (IC) dies 50A and 50B, also referred to as IC dies 50, are attached to the redistribution structure 512. Known good dies (KGDs) may be used for the IC dies 50A and 50B to provide good system yield. In some embodiments, IC dies 50A are a first type of IC die and IC dies 50B are a second type of IC die such as, e.g. logic dies (e.g., central processing unit (CPU), graphics processing unit (GPU), system-on-a-chip (SoC), application processor (AP), microcontroller, etc.), memory dies (e.g., dynamic random access memory (DRAM) dies, static random access memory (SRAM) die, etc.), power management dies (e.g., power management integrated circuit (PMIC) dies), radio frequency (RF) dies, sensor dies, micro-electro-mechanical-system (MEMS) dies, signal processing dies (e.g., digital signal processing (DSP) dies), front-end dies (e.g., analog front-end (AFE) dies), application-specific dies (e.g., an application-specific integrated circuit (ASIC), field-programmable gate array (FPGA), etc.), input/output (I/O) dies, integrated passive device (IPD) dies, or the like. In some embodiments, IC dies 50A and 50B are the same type of die or comprise three or more different types of dies. The IC dies 50A and 50B may be of the same technology node, or of different technology nodes. For example, the IC dies 50A and 50B may include dies formed at a 10 nm technology node, dies formed at a 7 nm technology node, the like, or combinations thereof.

In some embodiments, the IC dies 50A and 50B are attached to the redistribution structure 512 using a suitable bonding method, such as e.g. metal-metal bonding including Cu—Cu bonding or Al—Al bonding, between the die connectors 56 of the IC dies 50A and 50B and the vias of the top metallization pattern of the redistribution structure 512. In some embodiments, the IC dies 50A and 50B are attached to the redistribution structure 512 using hybrid bonds. However, any suitable method may be used to attach the IC dies 50A and 50B to the redistribution structure 512. In some embodiments, neighboring IC dies 50A and/or 50B are electrically coupled by electrical interconnects 538. In some embodiments, IC dies 50A and/or 50B located at larger distances from each other, such as being separated by at least one other IC die 50, are electrically coupled by electrical interconnects 540.

Figure 27:
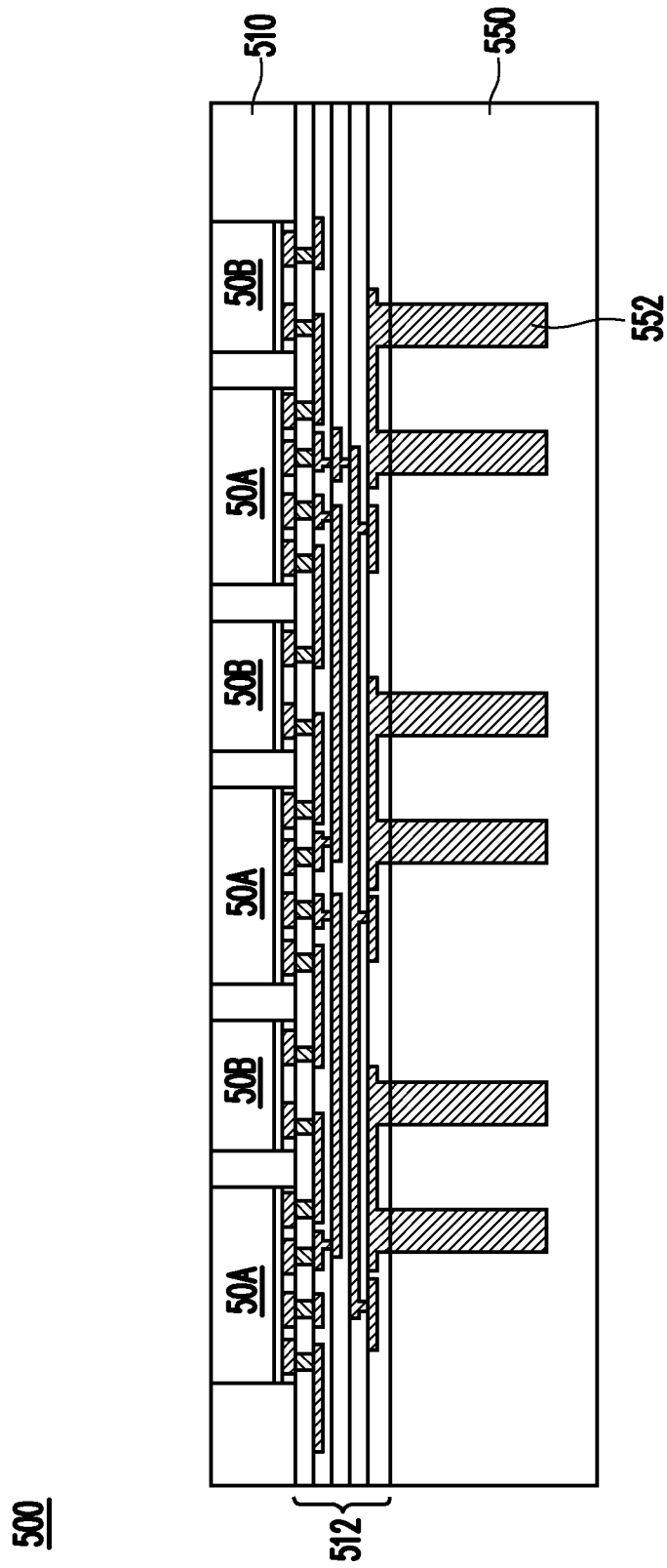

In FIG. 27, an encapsulant 510 is formed on and around the various components. After formation, the encapsulant 510 encapsulates the integrated circuit dies 50. The encapsulant 510 may be a molding compound, oxide, epoxy, or the like, and may be applied by compression molding, transfer molding, or the like. The encapsulant 510 may be applied in liquid or semi-liquid form and then subsequently cured. In some embodiments, the encapsulant 510 is formed over the wafer scale interposer 512 such that the integrated circuit dies 50 are buried or covered, and a planarization process is then performed on the encapsulant 510 to expose the topmost surfaces of the integrated circuit dies 50. The planarization process may be, for example, a grinding and/or a chemical-mechanical polish (CMP).

In some embodiments, multiple tiers of IC dies 50A and 50B are assembled over the redistribution structure 512. The multiple tiers of the IC dies 50 may be assembled by methods substantially similar as described above with respect to FIGS. 3 through 9, with the addition of the formation of additional redistribution structures 112' between tiers of the IC dies 50A and 50B. The additional redistribution structures 112' may electrically couple through substrate vias 51 within the IC dies 50A and 50B to die connectors 56 of the IC dies 50A and 50B in vertically adjacent tiers.

Figure 28:
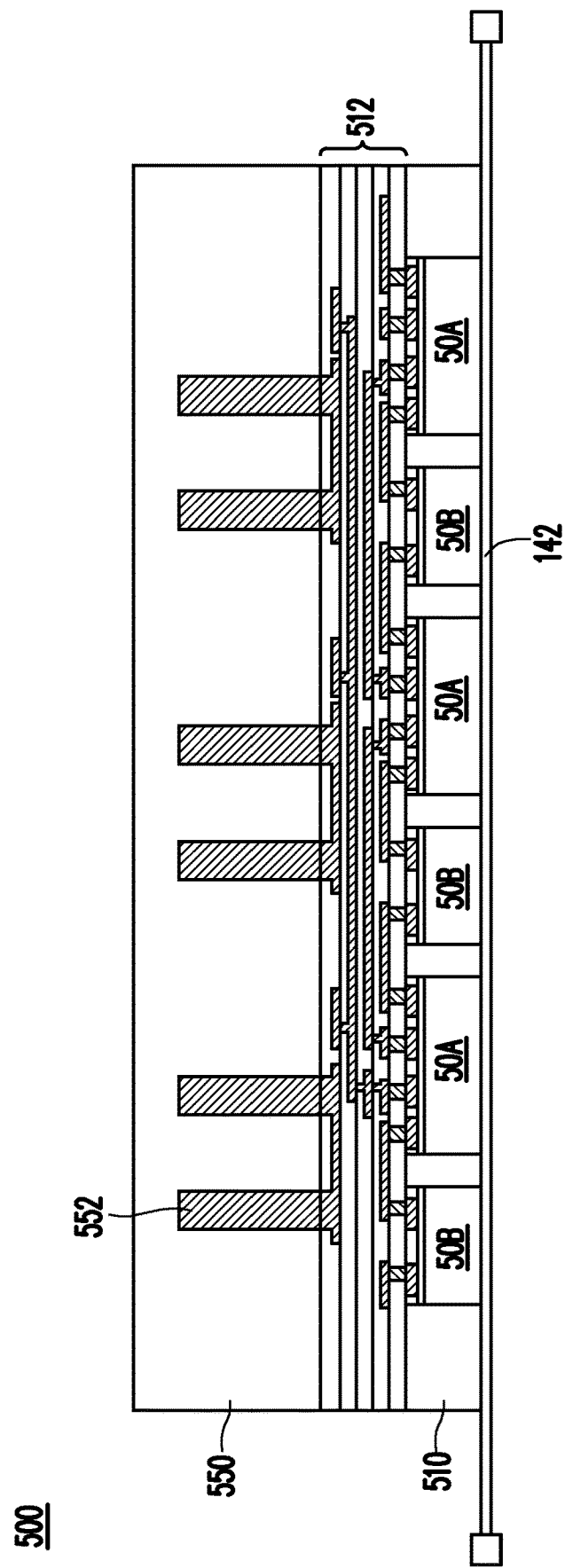
Figure 29:
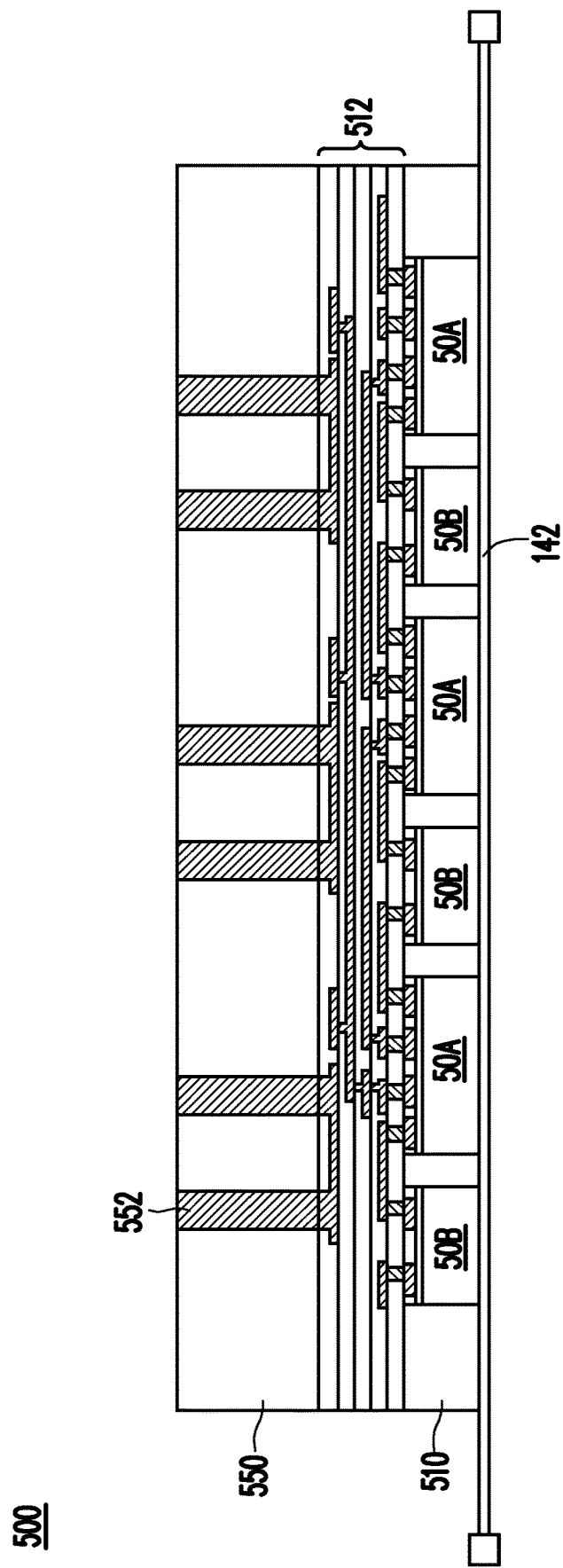

In FIG. 28, the wafer scale assembly 500 is flipped over. The wafer scale assembly 500 may then be placed on a tape 142. In FIG. 29, the back side of the substrate 550 (the side facing away from the tape 142) is planarized to expose top surfaces of the conductive vias 552, forming TSVs 552. The planarization process may be, for example, a grinding and/or a chemical-mechanical polish (CMP).

Figure 30:
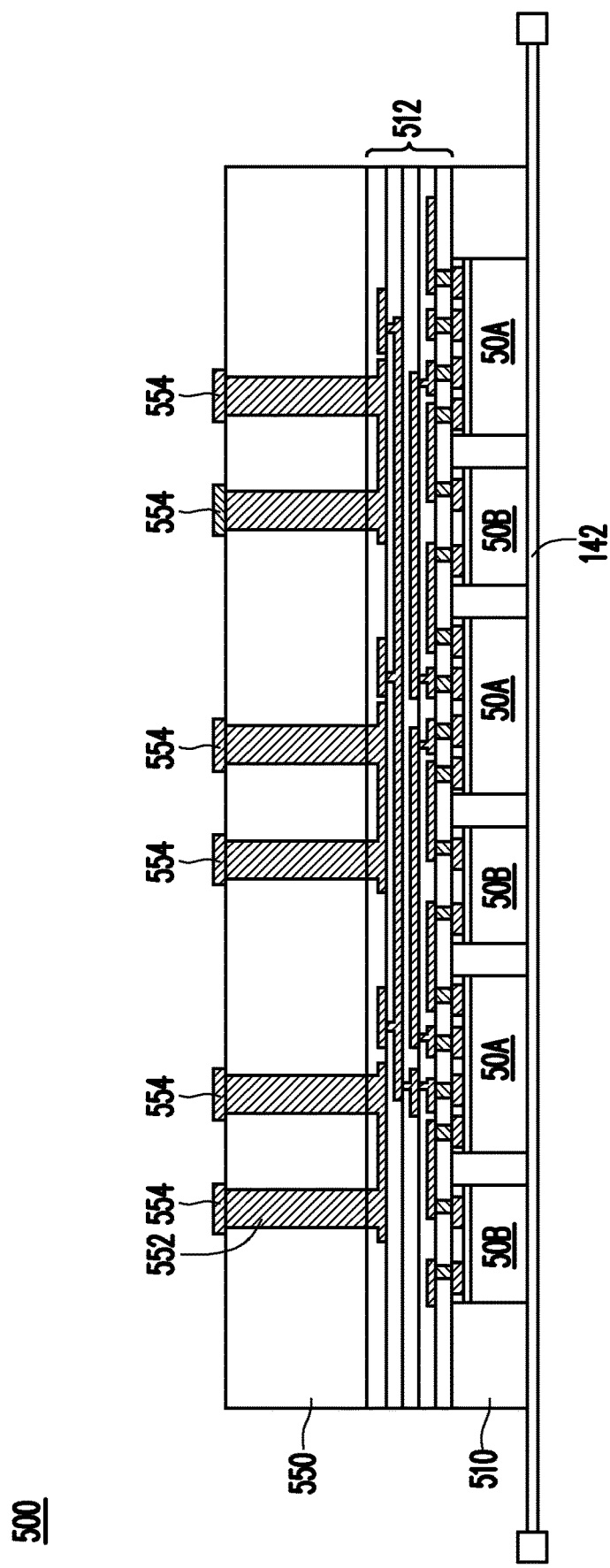

In FIG. 30, contact pads 554 are formed for external connection to the redistribution structure 512. The contact pads 554 are formed on top surfaces of the TSVs 552. As a result, the contact pads 554 are electrically coupled to the IC dies 50C and to metallization lines in the redistribution structure 512. The contact pads 554 may be formed in a similar manner and of a similar material as the metallization patterns of the redistribution structure 512. The contact pads 554 comprise a conductive material such as copper, titanium, tungsten, aluminum, the like, or a combination thereof.

Figure 31:
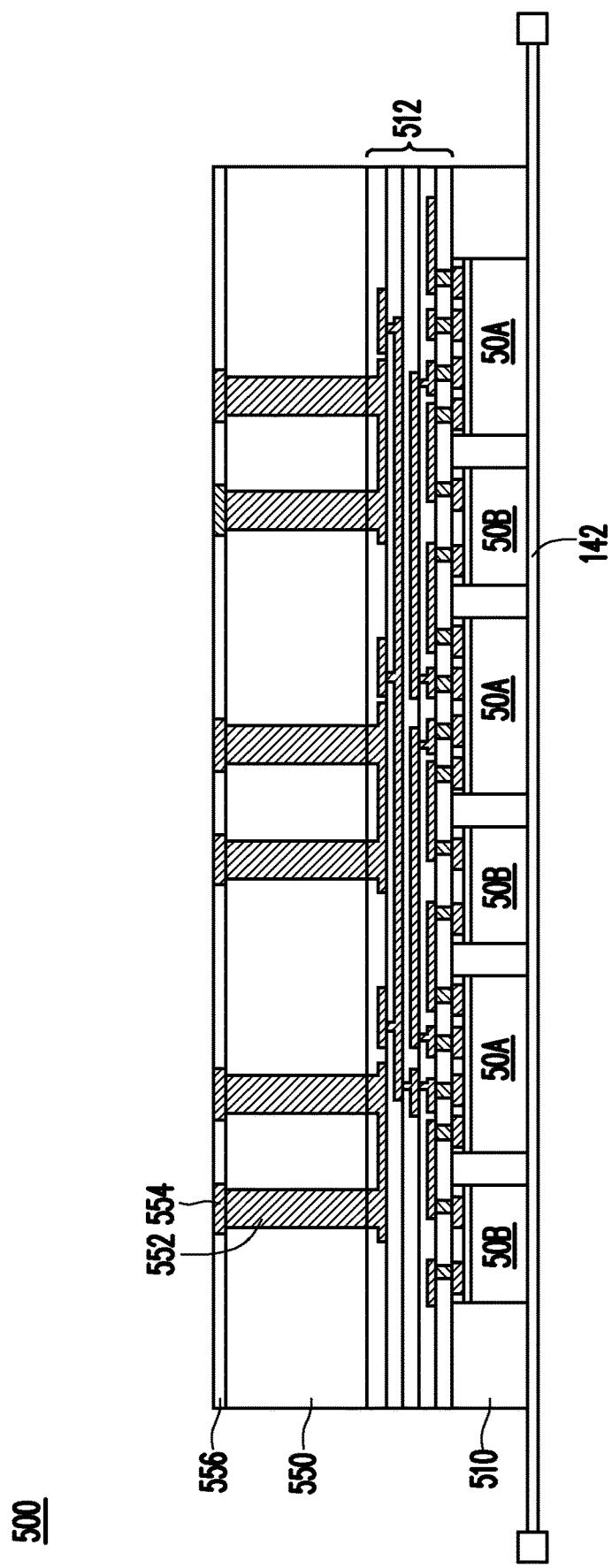

FIG. 31 shows a passivation layer 556 formed over top surfaces of the contact pads 554 and the substrate 550. The passivation layer 556 may be formed in a similar manner and of a similar material as the passivation layer 156 as described above in reference to FIG. 12A. However, any suitable method or materials may be used. The passivation layer 556 is patterned to form openings that expose top surfaces of the contact pads 554. The patterning of the passivation layer 656 may be performed by a similar lithographic method as the passivation layer 156. However, any suitable method may be used for the patterning.

FIG. 32A illustrates an external connector 558 attached to the system-on-wafer assembly 500. Although one external connector 558 is illustrated, multiple external connectors 558 may be attached to the system-on-wafer assembly 500. The external connector 558 is coupled to the system-on-wafer assembly 500 by conductive connectors 560 formed on conductive pads 554 that are coupled to TSVs 552. The conductive connectors 560 may be ball grid array (BGA) connectors, solder balls, metal pillars, controlled collapse chip connection (C4) bumps, micro bumps, electroless nickel-electroless palladium-immersion gold technique (ENEPIG) formed bumps, or the like. The conductive connectors 560 may include a conductive material such as solder, copper, aluminum, gold, nickel, silver, palladium, tin, the like, or a combination thereof. In some embodiments, the conductive connectors 560 are formed by initially forming a layer of solder or solder paste through evaporation, electroplating, printing, solder transfer, ball placement, or the like. Once a layer of solder has been formed on the structure, a reflow may be performed in order to shape the material into the desired bump shapes.

Further referring to FIG. 32A, the external connectors 558 are attached to the system-on-wafer assembly 500 by the conductive connectors 560. The external connectors 558 are electrical and physical interfaces for the system-on-wafer assembly 500 to external systems. For example, when the system-on-wafer assembly 500 is installed as part of a larger external system, such as a data center, the external connectors 558 may be used to couple the system-on-wafer assembly 500 to the external system. Examples of external connectors 558 include receptors for ribbon cables, flexible printed circuits, or the like. The external connectors 558 include pads 562, which may be similar to (and have the same pitch as) the conductive pads 554. The external connectors 558 may include different components, such as a chassis, the pads 562, and external connection pins, which may comprise different materials. The pads 562 and conductive connectors 560 are used for physical and electrical connection to the through vias 552. Attaching the external connectors 558 may include placing the external connectors 558 on the system-on-wafer assembly 500 using, e.g., a pick-and-place technique, and then reflowing the conductive connectors 560 to physically and electrically couple the conductive pads 554 and pads 562.

FIG. 32B illustrates a cross-sectional view of a system-on-wafer assembly 600 with multiple tiers of IC dies 50, in accordance with some embodiments. The system-on-wafer assembly 600 is substantially similar to the system-on-wafer assembly 500 as described above with respect to FIG. 32A, but with multiple tiers of IC dies 50A and 50B assembled below the redistribution structure. Although FIG. 32B illustrates two tiers of IC dies 50A and 50B, in some embodiments more than two tiers of the IC dies 50A and 50B may be present. The multiple tiers of the IC dies 50 may be assembled by methods substantially similar as described above with respect to FIGS. 3 through 9, with the addition of the formation of additional redistribution structures 512' between tiers of the IC dies 50A and 50B. The additional redistribution structures 112' may electrically couple through substrate vias 51 within the IC dies 50A and 50B to die connectors 56 of the IC dies 50A and 50B in vertically adjacent tiers. The additional redistribution structures 512' may be formed by substantially similar methods as the redistribution structure 112, as described above with respect to FIG. 3.

Wafer scale interposers, such as back end of line (BEOL) layers, may be attached to multiple chips (also referred to as dies. Electrical interconnects between a first die and neighboring dies and/or between the first die and others dies located at larger distances from the first die, such as on an opposite side of the wafer scale interconnect, may be supported on wafer scale BEOL layers. Forming the wafer scale interposer may be done by overlapping lithographic exposures of the BEOL using stitching technology to integrate each reticle of the BEOL or by using a wafer scale mask over the BEOL to overcome the reticle size limitation. Chips can be bonded on one side or on both sides of the wafer scale interposer to improve yield and allow for high density integration. This single sided or double sided assembly may be useful for increasing system application flexibility. Known good dies (KGDs) can be attached to the wafer scale interposers to provide good system yield. Metal-metal bonds, such as Cu—Cu bonds, may be used between the dies and the wafer scale interposer to form fine pitch contact pads for high density signals and/or larger size contact pads with low resistance to achieve better yield with lower power for high speed signals. Multiple system modules may be converged into one wafer scale system to simplify system architecture in order to reduce cost. In order to provide design flexibility for different applications, dies with different functions such as logic, memory, input/output (I/O), power management integrated circuit (PMIC), or integrated passive device (IPD) may be integrated on the wafer scale system. Mechanical or optical connector modules may be integrated with the wafer scale interposer for wafer-to-wafer system interconnection.

In accordance with an embodiment, a semiconductor device includes: a first plurality of dies, the first plurality of dies being on a wafer; a first redistribution structure over the first plurality of dies, the first redistribution structure including a first plurality of conductive features, each die of the first plurality of dies being bonded to respective conductive features of the first plurality of conductive features by metal-metal bonds on a bottom side of the first redistribution structure, a first die of the first plurality of dies being adjacent to a second die of the first plurality of dies, the first die being electrically connected to the second die by a first electrical interconnect through the first redistribution structure, and a third die of the first plurality of dies being separated from the first die by another die of the first plurality of dies, the third die being electrically connected to the first die by a second electrical interconnect through the first redistribution structure; and a second plurality of dies, the second plurality of dies being on a top side of the first redistribution structure opposite the bottom side, each die of the second plurality of dies being bonded to respective conductive features of the first plurality of conductive features in the first redistribution structure by metal-metal bonds on the top side. In an embodiment, the first plurality of dies is encapsulated by a first encapsulant. In an embodiment, the second plurality of dies is encapsulated by a second encapsulant. In an embodiment, the first redistribution structure includes a third electrical interconnect between the first die of the first plurality of dies and a fourth die of the second plurality of dies. In an embodiment, the semiconductor device further includes a third plurality of dies, the third plurality of dies being on a back side of the first plurality of dies, each die of the first plurality of dies including a respective through substrate via, each die of the third plurality of dies being metal-metal bonded to a respective die of the first plurality of dies and each die of the third plurality of dies being physically and electrically coupled with a respective through substrate via of the respective die of the first plurality of dies. In an embodiment, the semiconductor device further includes a fourth plurality of dies, the fourth plurality of dies being on a side of the second plurality of dies opposite the first redistribution structure, each die of the fourth plurality of dies being on a respective die of the second plurality of dies, each die of the second plurality of dies including a respective through substrate via, each die of the fourth plurality of dies being metal-metal bonded to the respective die of the second plurality of dies and being physically and electrically coupled with the respective through substrate via of the respective die of the second plurality of dies. In an embodiment, the semiconductor device further includes a molding compound encapsulating the first plurality of dies, the first redistribution structure, the second plurality of dies, and the wafer; and a second redistribution structure over the molding compound, the first plurality of dies, the first redistribution structure, the second plurality of dies, and the wafer, wherein the second redistribution structure includes a second plurality of conductive features and a plurality of dielectric layers. In an embodiment, the semiconductor device further includes each die of the second plurality of dies being bonded to respective conductive features of the second plurality of conductive features by metal-metal bonds on a bottom side of the second redistribution structure. In an embodiment, the semiconductor device further includes a through dielectric via (TDV) on a top side of the first redistribution structure opposite the bottom side, the TDV being bonded to a conductive feature of the first plurality of conductive features in the first redistribution structure by a metal-metal bond; and a conductive pad on the TDV, the conductive pad being opposite the first redistribution structure. In an embodiment, the TDV is electrically connected to an adjacent die of the second plurality of dies by a fourth electrical interconnect through the first redistribution structure. In an embodiment, the semiconductor device further includes an external connector, the external connector being electrically and physically coupled to the conductive pad by a conductive connector.

In accordance with another embodiment, a semiconductor device includes: a first plurality of dies, the first plurality of dies being encapsulated by an encapsulant; a redistribution structure over the first plurality of dies, each die of the first plurality of dies being electrically connected to respective conductive features of the redistribution structure, a first die of the first plurality of dies being interposed between a second die of the first plurality of dies and a third die of the first plurality of dies, the first die being electrically connected to the second die by a first electrical interconnect through the redistribution structure, and the second die being electrically connected to the third die by a second electrical interconnect through the redistribution structure; and an interposer over the redistribution structure, the interposer having a first plurality of conductive pads on a top surface, the interposer having a plurality of through substrate vias (TSVs) extending through the interposer, each conductive pad of the first plurality of conductive pads being electrically connected to respective conductive features of the redistribution structure by a respective TSV of the plurality of TSVs. In an embodiment, each die of the first plurality of dies being electrically connected to respective conductive features of the redistribution structure further includes respective Cu—Cu bonds. In an embodiment, the semiconductor device further includes a connector on the interposer, the connector being electrically coupled to at least one conductive pad of the first plurality of conductive pads. In an embodiment, the semiconductor device further includes a second plurality of dies, the second plurality of dies being below the first plurality of dies opposite the redistribution structure. In an embodiment, each die of the first plurality of dies includes a through substrate via (TSV), each TSV being coupled to a respective die of the second plurality of dies.

In accordance with yet another embodiment, a method of forming a semiconductor device includes: forming a first interconnect on a substrate; coupling a first plurality of dies to the first interconnect on a first surface, each die of the first plurality of dies being coupled to the first interconnect with metal-metal bonds; encapsulating the first plurality of dies with a first encapsulant; attaching a wafer to top surfaces of the first plurality of dies and the first encapsulant; forming a plurality of through dielectric vias (TDVs) on a second surface of the first interconnect opposite of the first surface; coupling a second plurality of dies to the first interconnect on the second surface, each die of the second plurality of dies including a through substrate via (TSV); encapsulating the second plurality of dies with a second encapsulant; forming respective conductive pads on respective top surfaces of each TDV of the plurality of TDVs and on respective top surfaces of each TSV; forming a passivation layer over the second plurality of dies and the second encapsulant; and forming openings in the passivation layer to expose top surfaces of each conductive pad. In an embodiment, the method further includes forming respective conductive connectors on the respective conductive pads. In an embodiment, the method further includes coupling an external connector to at least one conductive connector of the respective conductive connectors. In an embodiment, the respective conductive pads include Al.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor device, comprising:
    forming a first redistribution structure on a first carrier, wherein the first redistribution structure comprises a first plurality of conductive features and a first plurality of dielectric layers;
    bonding a first plurality of dies to the first redistribution structure at a first side, wherein the first plurality of dies comprise through substrate vias (TSVs);
    encapsulating the first plurality of dies with a first encapsulant;
    forming a second redistribution structure on the first plurality of dies and the first encapsulant, wherein the second redistribution structure comprises a second plurality of conductive features and a second plurality of dielectric layers, and wherein the second plurality of conductive features are electrically connected to the TSVs of the first plurality of dies;
    bonding a second plurality of dies to the second redistribution structure;
    encapsulating the second plurality of dies with a second encapsulant;
    attaching a support substrate to surfaces of the second plurality of dies and the second encapsulant;
    removing the first carrier;
    bonding a third plurality of dies to the first redistribution structure at a second side opposite of the first side, wherein the third plurality of dies comprise TSVs; and encapsulating the third plurality of dies with a third encapsulant.

2. The method of claim 1, wherein the first plurality of dies are bonded to the first redistribution structure by metal-metal bonding and fusion bonding.

3. The method of claim 1, wherein the third plurality of dies are bonded to the first redistribution structure by metal-metal bonding and fusion bonding.

4. The method of claim 1, further comprising forming a molding compound encapsulating the first plurality of dies, the second plurality of dies, the third plurality of dies, the first redistribution structure, the second redistribution structure, and the support substrate.

5. The method of claim 4, further comprising:
forming a third redistribution structure over the molding compound and the third plurality of dies, wherein the third redistribution structure comprises a third plurality of conductive features and a third plurality of dielectric layers.

6. The method of claim 1 further comprising:
forming a plurality of through dielectric vias (TDVs) at the second side of the first redistribution structure beside the third plurality of dies, wherein the TDVs are electrically connected to the first plurality of conductive features; and
encapsulating the TDVs with the third encapsulant.

7. The method of claim 1 further comprising:
forming a third redistribution structure on the third plurality of dies and the third encapsulant, wherein the third redistribution structure comprises a third plurality of conductive features and a third plurality of dielectric layers, and wherein the third plurality of conductive features are electrically connected to the TSVs of the third plurality of dies; and
bonding a fourth plurality of dies to the third redistribution structure, wherein the fourth plurality of dies comprise TSVs.

8. The method of claim 7 further comprising:
forming a plurality of conductive pads on the fourth plurality of dies, wherein the plurality of conductive pads are electrically connected to the TSVs of the fourth plurality of dies; and
forming a passivation layer on fourth plurality of dies, wherein the plurality of conductive pads extend through the passivation layer.

9. The method of claim 8, wherein the support substrate is a wafer.

10. A method of forming a semiconductor device, comprising:
forming a first redistribution structure on a first side of a wafer comprising an interposer, wherein the first redistribution structure comprises a first plurality of conductive features, wherein the interposer comprises a plurality of conductive vias electrically connected to the first plurality of conductive features;
coupling a first plurality of dies to the first redistribution structure;
encapsulating the first plurality of dies with a first encapsulant;
thinning a second side of the wafer comprising the interposer to expose the plurality of conductive vias at the second side; and forming a plurality of conductive pads on the plurality of conductive vias at the second side of the wafer comprising the interposer.

11. The method of claim 10, further comprising attaching an external connector to the plurality of conductive pads.

12. The method of claim 10 further comprising:
forming a passivation layer at the second side of the wafer comprising the interposer, wherein the plurality of conductive pads extend through the passivation layer.

13. The method of claim 10 further comprising:
bonding a second plurality of dies to the first redistribution structure by metal-metal bonding and fusion bonding; and
encapsulating the second plurality of dies with a second encapsulant.

14. The method of claim 13 further comprising:
forming a second redistribution structure on the second plurality of dies and the second encapsulant, wherein the second redistribution structure comprises a second plurality of conductive features and a second plurality of dielectric layers.

15. The method of claim 14, wherein the second plurality of dies comprises through substrate vias (TSVs), and wherein the TSVs are electrically connected to the second plurality of conductive features.

16. The method of claim 14, wherein the first plurality of dies are bonded to the second redistribution structure by metal-metal bonding and fusion bonding.

17. A method of forming a semiconductor device, comprising:
forming a first interconnect on a substrate;
coupling a first plurality of dies to the first interconnect on a first surface, each die of the first plurality of dies being coupled to the first interconnect with metal-metal bonds;
encapsulating the first plurality of dies with a first encapsulant;
attaching a wafer to surfaces of the first plurality of dies and the first encapsulant;
forming a plurality of through dielectric vias (TDVs) on a second surface of the first interconnect opposite of the first surface;
coupling a second plurality of dies to the first interconnect on the second surface, each die of the second plurality of dies comprising a through substrate via (TSV);
encapsulating the second plurality of dies with a second encapsulant;
forming respective conductive pads on a surface of each TDV of the plurality of TDVs and on a surface of each TSV;
forming a passivation layer over the second plurality of dies and the second encapsulant; and
forming openings in the passivation layer to expose a surface of each conductive pad.

18. The method of claim 17 further comprising forming respective conductive connectors on the respective conductive pads.

19. The method of claim 18 further comprising coupling an external connector to at least one conductive connector of the respective conductive connectors.

20. The method of claim 17, wherein the respective conductive pads comprise Al.

* * * * *